United States Patent
Takamine

(10) Patent No.: US 10,742,194 B2
(45) Date of Patent: Aug. 11, 2020

(54) FILTER

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 115 days.

(21) Appl. No.: 16/142,077

(22) Filed: Sep. 26, 2018

(65) Prior Publication Data

US 2019/0140618 A1    May 9, 2019

(30) Foreign Application Priority Data

Oct. 2, 2017    (JP) ................. 2017-192723

(51) Int. Cl.
*H03H 9/64* (2006.01)
*H03H 9/00* (2006.01)
(Continued)

(52) U.S. Cl.
CPC ........ *H03H 9/6489* (2013.01); *H03H 9/0009* (2013.01); *H03H 9/02559* (2013.01); *H03H 9/02574* (2013.01); *H03H 9/02834* (2013.01); *H03H 9/02866* (2013.01); *H03H 9/02937* (2013.01); *H03H 9/14541* (2013.01);
(Continued)

(58) Field of Classification Search
CPC ............... H03H 9/6489; H03H 9/0009; H03H 9/02559; H03H 9/02574; H03H 9/02834; H03H 9/02866; H03H 9/02937; H03H 9/14541; H03H 9/25; H03H 9/542; H03H 9/587; H03H 9/589; H03H 9/605; H03H 9/6483; H03H 9/725
See application file for complete search history.

(56) References Cited

U.S. PATENT DOCUMENTS

2003/0098761 A1    5/2003    Takeuchi et al.
2011/0316648 A1    12/2011   Fujita
(Continued)

FOREIGN PATENT DOCUMENTS

JP    2003-229743 A    8/2003
JP    2012-151697 A    8/2012
(Continued)

OTHER PUBLICATIONS

Official Communication issued in Korean Patent Application No. 10-2018-0116109, dated Aug. 13, 2019.
(Continued)

*Primary Examiner* — Benny T Lee
*Assistant Examiner* — Hafizur Rahman
(74) *Attorney, Agent, or Firm* — Keating & Bennett, LLP

(57) ABSTRACT

A filter includes n series resonators, one or more parallel resonators, a first inductor between a first terminal and a first of the n series resonators, and a second inductor between an n-th series resonator and a second terminal. Where a resonant frequency of the first series resonator is referred to as a first resonant frequency, a resonant frequency of each of the series resonators other than the first series resonator and the n-th series resonator is referred to as a second resonant frequency, and a resonant frequency of the n-th series resonator is referred to as a third resonant frequency, the first resonant frequency and the third resonant frequency are each higher than the second resonant frequency.

18 Claims, 14 Drawing Sheets

(51) Int. Cl.
- H03H 9/02 (2006.01)
- H03H 9/72 (2006.01)
- H03H 9/145 (2006.01)
- H03H 9/25 (2006.01)
- H03H 9/58 (2006.01)
- H03H 9/60 (2006.01)
- H03H 9/54 (2006.01)

(52) U.S. Cl.
CPC .............. *H03H 9/25* (2013.01); *H03H 9/542* (2013.01); *H03H 9/587* (2013.01); *H03H 9/589* (2013.01); *H03H 9/605* (2013.01); *H03H 9/6483* (2013.01); *H03H 9/725* (2013.01)

(56) References Cited

U.S. PATENT DOCUMENTS

| | | |
|---|---|---|
| 2012/0182088 A1 | 7/2012 | Inoue et al. |
| 2014/0218128 A1 | 8/2014 | Fujita |
| 2015/0222246 A1 | 8/2015 | Nosaka |
| 2016/0285431 A1 | 9/2016 | Nakahashi et al. |
| 2017/0155376 A1 | 6/2017 | Yamaguchi |
| 2018/0062615 A1 | 3/2018 | Kato et al. |
| 2018/0123565 A1 | 5/2018 | Takamine |

FOREIGN PATENT DOCUMENTS

| | | |
|---|---|---|
| JP | 2016-184900 A | 10/2016 |
| KR | 10-2005-0055819 A | 6/2005 |
| WO | 2010/103882 A1 | 9/2010 |
| WO | 2013/061694 A1 | 5/2013 |
| WO | 2013/065488 A1 | 5/2013 |
| WO | 2014/064987 A1 | 5/2014 |
| WO | 2016/024559 A1 | 2/2016 |
| WO | 2016/181701 A1 | 11/2016 |
| WO | 2016/208677 A1 | 12/2016 |

OTHER PUBLICATIONS

Official Communication issued in Japanese Patent Application No. 2017-192723, dated Feb. 12, 2020.

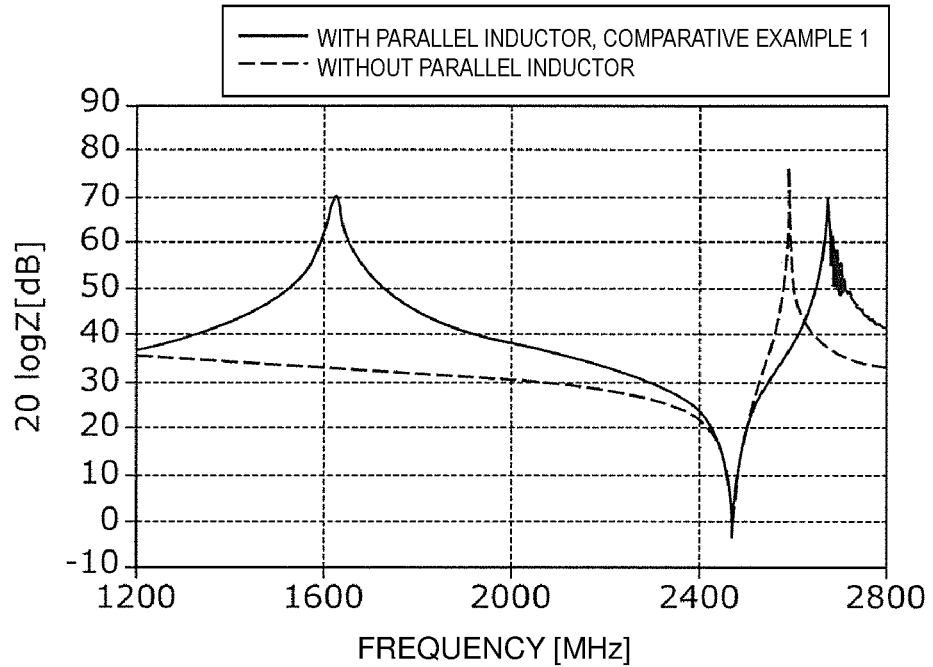
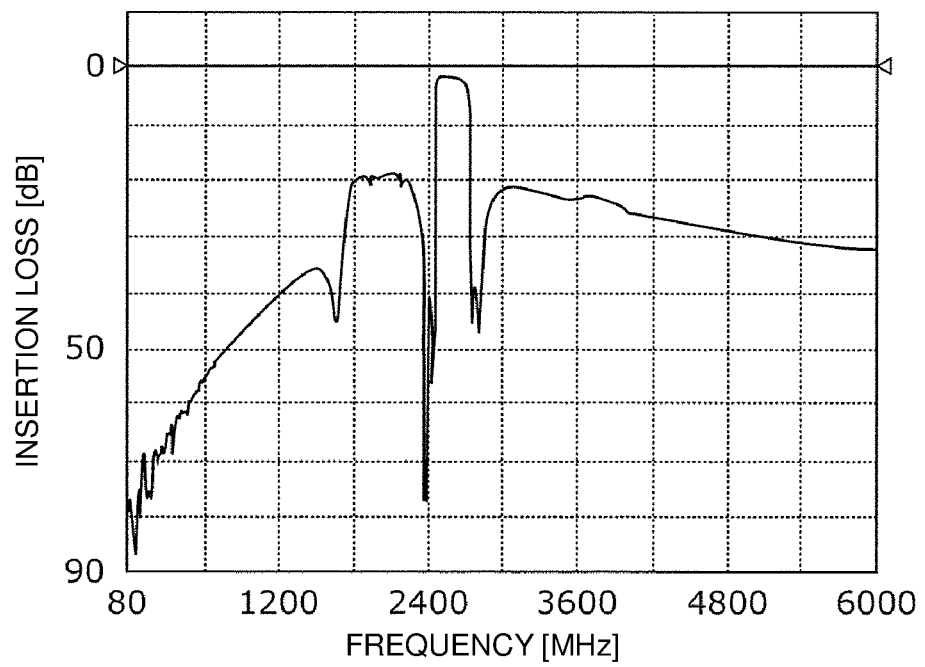

FILTER

CROSS REFERENCE TO RELATED APPLICATIONS

This application claims the benefit of priority to Japanese Patent Application No. 2017-192723 filed on Oct. 2, 2017. The entire contents of this application are hereby incorporated herein by reference.

BACKGROUND OF THE INVENTION

1. Field of the Invention

The present invention relates to a filter including series resonators and one or more parallel resonators.

2. Description of the Related Art

Recently, a multiplexer for demultiplexing (branching) a radio frequency signal per frequency band has been widely used in communication devices, such as cellular phone terminals, to be adapted for a plurality of frequency bands and a plurality of radio systems, i.e., for a tendency toward multiple bands and multiple modes, with one terminal. A ladder filter including a series resonator and a parallel resonator is proposed as a filter for use in the above-mentioned multiplexer (see, for example, International Publication No. 2014/064987).

The filter disclosed in International Publication No. 2014/064987 includes a plurality of series resonators disposed in series in a path that interconnects an input terminal and an output terminal, and a plurality of parallel resonators each disposed in a path between a node between the series resonators adjacent to each and a ground. Furthermore, in the disclosed filter, an inductor is connected in parallel to each of two among the plurality of parallel resonators, those two being positioned at both ends. According to the filter disclosed in International Publication No. 2014/064987, a pass band width of the filter is widened by connecting the inductor in parallel to the parallel resonator.

However, the filter disclosed in International Publication No. 2014/064987 may often cause a phenomenon that a resonance (hereinafter also called a "spurious resonance" in some cases) at a frequency different from a resonant frequency is generated by an L component of the inductor connected in parallel and a C component of the parallel resonator, and that an attenuation outside the pass band becomes insufficient.

The spurious resonance is not problematic from the viewpoint of characteristics within the pass band of the relevant filter itself. In a multiplexer including a plurality of filters, however, because paths passing the individual filters are interconnected, the spurious resonance may become a factor affecting and degrading characteristics of the other filters. More specifically, when the spurious resonance is positioned within a pass band of another filter, it becomes a factor increasing an insertion loss in the pass band of the other filter.

SUMMARY OF THE INVENTION

Preferred embodiments of the present invention provide filters that are each capable of widening a pass band width and increasing an attenuation outside a pass band.

A filter according to a preferred embodiment of the present invention includes a first terminal and a second terminal; a number n of series resonators (n is a natural number of three or more) that are disposed in series in a first path interconnecting the first terminal and the second terminal; one or more parallel resonators that are disposed in paths interconnecting respectively nodes between adjacent pairs of the series resonators in the first path and a ground; a first inductor that is disposed in the first path between the first terminal and a first series resonator among the number n of series resonators, the first series resonator being closest to the first terminal; and a second inductor that is disposed in the first path between the second terminal and an n-th series resonator among the number n of series resonators, the n-th series resonator being closest to the second terminal, wherein, when a resonant frequency of the first series resonator is referred to as a first resonant frequency, that a resonant frequency of each of the series resonators other than the first series resonator and the n-th series resonator is referred to as a second resonant frequency, and a resonant frequency of the n-th series resonator is referred to as a third resonant frequency, the first resonant frequency and the third resonant frequency are each higher than the second resonant frequency.

With the features described above, a pass band width of the filter is able to be widened, a spurious resonance which may be generated at a frequency different from the resonant frequency is able to be reduced or prevented, and an attenuation outside a pass band is able to be increased.

Each of the number n of series resonators and the one or more parallel resonators may include an IDT electrode that is provided on a substrate having piezoelectricity, the IDT electrode may include a plurality of electrode fingers that extend in a direction perpendicular or substantially perpendicular to an elastic wave propagation direction, and when an average pitch of the plurality of electrode fingers adjacent to each other in the acoustic wave propagation direction in the first series resonator is referred to as a first pitch, that an average pitch of the plurality of electrode fingers adjacent to each other in the acoustic wave propagation direction in each of the series resonators other than the first series resonator and the n-th series resonator is referred to as a second pitch, and an average pitch of the plurality of electrode fingers adjacent to each other in the acoustic wave propagation direction in the n-th series resonator is referred to as a third pitch, the first pitch and the third pitch may each be smaller than the second pitch.

With the features described above, a pass band width of the filter including surface acoustic wave resonators or boundary acoustic wave resonators is able to be widened, the spurious resonance which may be generated at the frequency different from the resonant frequency is able to be reduced or prevented, and the attenuation outside the pass band is able to be increased.

The first pitch and the third pitch may be each not less than about 0.952 times and not more than about 0.98 times the second pitch.

With the feature described above, an impedance mismatch in the pass band of the filter is able to be reduced, and an insertion loss in the pass band is able to be reduced.

Capacitances of the first series resonator and the n-th series resonator may each be smaller than a capacitance of each of the other series resonators.

By reducing the capacitances of the first series resonator and the n-th series resonator as described above, the attenuation outside the pass band of the filter is able to be further increased.

Division numbers of the first series resonator and the n-th series resonator may be each greater than a division number of each of the other series resonators.

With the feature described above, the resonator capacitance after the division is able to be increased. As a result, the occurrence of a ripple is reduced or prevented at the lower frequency side than the resonant frequency of each of the first series resonator and the n-th series resonator.

The number n of series resonators may be five or more series resonators.

With the feature described above, the attenuation outside the pass band of the filter is able to be further increased.

The filter may have a pass band at frequencies of not lower than about 2496 MHz and not higher than about 2690 MHz.

With the feature described above, a filter that is capable of increasing the attenuation outside the pass band of Band41 is obtained.

The number n of series resonators and the one or more parallel resonators may each be a piezoelectric thin film resonator utilizing thickness longitudinal, expansion vibration of a bulk wave, each resonator including a piezoelectric layer, a first side electrode layer provided at one principal surface of the piezoelectric layer, and a second side electrode layer provided at the other principal surface of the piezoelectric layer, wherein, when an average thickness of the first side electrode layer and the second side electrode layer in the first series resonator is referred to as a first thickness, that an average thickness of the first side electrode layer and the second side electrode layer in each of the series resonators other than the first series resonator and the n-th series resonator is referred to as a second thickness, and an average thickness of the first side electrode layer and the second side electrode layer in the n-th series resonator is referred to as a third thickness, the first thickness and the third thickness may be each smaller than the second thickness.

With the features described above, a pass band width of the filter including the piezoelectric thin film resonators is able to be widened, the spurious resonance which may be generated at the frequency different from the resonant frequency is able to be reduced or prevented, and the attenuation outside the pass band is able to be increased.

A filter according to another preferred embodiment of the present invention includes a first terminal and a second terminal; three or more series resonators that are disposed in series in a first path interconnecting the first terminal and the second terminal; one or more parallel resonators that are disposed in paths interconnecting respectively nodes between adjacent pairs of the series resonators in the first path and a ground; and a first inductor that is disposed in the first path between the first terminal and a first series resonator among the three or more series resonators, the first series resonator being closest to the first terminal, wherein each of the three or more series resonators and the one or more parallel resonators includes an IDT electrode that is provided on a substrate having piezoelectricity, wherein the IDT electrode includes a plurality of electrode fingers that extend in a direction perpendicular or substantially perpendicular to an acoustic wave propagation direction, and wherein, when an average pitch of the plurality of electrode fingers adjacent to each other in the acoustic wave propagation direction in the first series resonator is referred to as a first pitch, and an average pitch of the electrode fingers adjacent to each other in the acoustic wave propagation direction in each of the series resonators other than the first series resonator is referred to as a second pitch, the first pitch is not less than about 0.952 times and not more than about 0.98 times the second pitch.

With the features described above, a pass band width of the filter is able to be widened, a spurious resonance which may be generated at a frequency different from the resonant frequency is able to be reduced or prevented, and an attenuation outside a pass band is able to be increased. In addition, an impedance mismatch in the pass band of the filter and an insertion loss in the pass band are able to be reduced.

A multiplexer for transmitting and/or receiving signals in a plurality of frequency bands at the same time according to another preferred embodiment of the present invention includes at least one of any of the above-described filters according to preferred embodiments of the present invention.

With the features described above, in the multiplexer, the pass band width of the filter is able to be widened, the spurious resonance which may be generated at the frequency different from the resonant frequency is able to be reduced or prevented, and the attenuation outside the pass band is able to be increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B are graphs representing respectively an impedance of a parallel resonator and transfer characteristics of the filter according to Comparative Example 1.

DETAILED DESCRIPTION OF THE PREFERRED EMBODIMENTS

Figure 1:
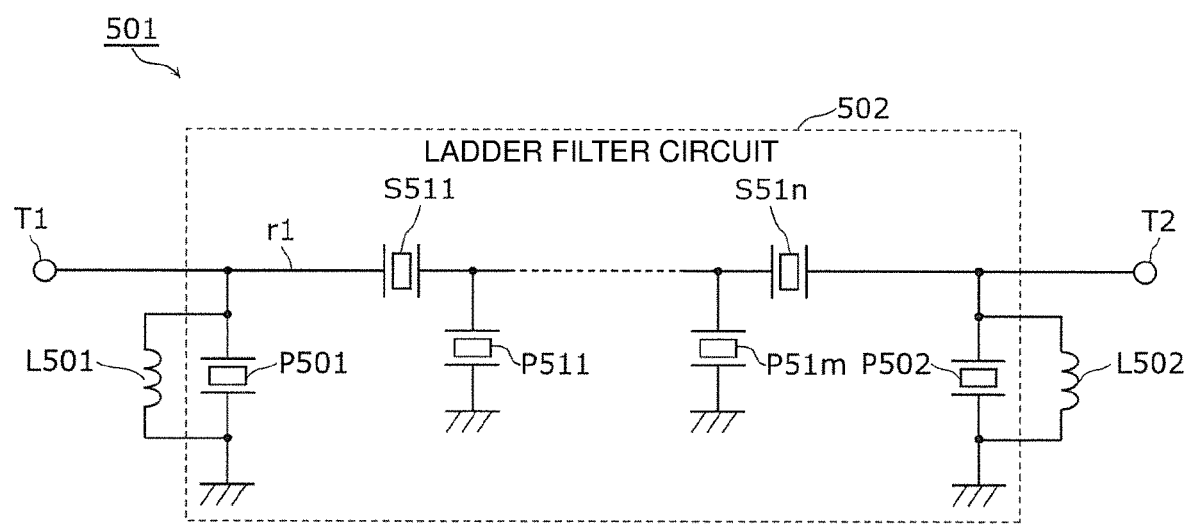
FIG. 1 is a circuit diagram of a filter according to Comparative Example 1.

A background of the present invention is first described with reference to FIG. 1 and FIGS. 2A and 2B. FIG. 1 is a circuit diagram of a filter 501 according to Comparative Example 1.

The filter 501 according to Comparative Example 1 includes a ladder filter circuit 502. The ladder filter circuit 502 includes series resonators S511 to S51$n$ ($n$ is an integer of 3 or more) that are disposed in a first path r1 interconnecting a first terminal T1 and a second terminal T2, and parallel resonators P501, P511 to P51$m$ ($m$ is an integer of 2 or more), and P502 that are each disposed in a path interconnecting the first path r1 and a ground. The parallel resonator P501 is disposed in a path interconnecting a node between the first terminal T1 and the series resonator S511 and the ground. The parallel resonator P502 is disposed in a path interconnecting a node between the series resonator S51$n$ and the second terminal T2 and the ground. The filter 501 further includes an inductor L501 connected in parallel to the parallel resonator P501, and an inductor L502 connected in parallel to the parallel resonator P502.

When communication is performed using Band41 (pass band: about 2496 MHz to about 2690 MHz), for example, it is usual to widen a frequency interval between a resonant frequency and an anti-resonant frequency by connecting the inductors L501 and L502 in parallel respectively to the parallel resonators P501 and P502 in the ladder filter circuit 502, as illustrated in FIG. 1, for the purpose of widening a pass band width of the filter 501.

A problem that may occur in the filter 501 according to Comparative Example 1 will be described below with reference to FIGS. 2A and 2B. FIGS. 2A and 2B are graphs representing respectively an impedance of the parallel resonator P501 and transfer characteristics of the filter 501 according to Comparative Example 1.

In FIG. 2A, a solid line represents the impedance of the parallel resonator P501 to which the inductor L501 is connected in parallel, and a dotted line represents the impedance of the parallel resonator P501 on an assumption that the inductor L501 is not connected. FIG. 2B represents an insertion loss inside and outside the pass band of the filter 501 including the inductors L501 and L502.

As illustrated in FIG. 2A, when the inductor L501 is connected in parallel to the parallel resonator P501, the anti-resonant frequency of the parallel resonator P501 becomes higher, and the frequency interval between the resonant frequency and the anti-resonant frequency is widened. Accordingly, the pass band width of the filter 501 is widened. However, a spurious resonance at a frequency different from the resonant frequency occurs at the lower frequency side than the resonant frequency as denoted near a frequency of 1600 MHz in FIG. 2A. In the filter 501, therefore, a frequency band in which an attenuation is insufficient is generated at the lower frequency side than the pass band, as illustrated in FIG. 2B.

The frequency band in which the attenuation is insufficient overlaps Band3 (Tx: about 1710 to about 1785 MHz, Rx: about 1805 to about 1880 MHz), or Band25 (Tx: about 1850 to about 1915 MHz, Rx: about 1930 to about 1995 MHz). Accordingly, in trying to communicate signals in a plurality of frequency bands at the same time using a multiplexer including the filter 501, for example, the spurious resonance generated in the filter 501 causes an increase of the insertion loss in the pass band of Band3 or Band25.

Filters according to preferred embodiments of the present invention are structured and configured to be able to widen the pass band width, reduce or prevent the occurrence of the spurious resonance at the frequency different from the resonant frequency, and increase the attenuation outside the pass band.

The preferred embodiments of the present invention will be described in detail below with reference to examples and the drawings. It is to be noted that each of the following preferred embodiments represents a general or specific example. Thus, numerical values, shapes, materials, elements, arrangements and connection structures of the elements, etc., which are described in the following preferred embodiments, are merely illustrative, and they do not limit the scope of the present invention. Among the elements in the following preferred embodiments, those not recited in independent Claims are described as being elements that may be used optionally. Sizes or relative size ratios of the elements illustrated in the drawings are not always exactly true in a strict sense. In the drawings, the same or substantially the same elements are denoted by the same reference characters, and duplicate description of those elements is omitted or simplified in some cases.

Preferred Embodiment 1

A filter 1 according to Preferred Embodiment 1 of the present invention will be described below with reference to FIGS. 3 to 8.

Figure 3:
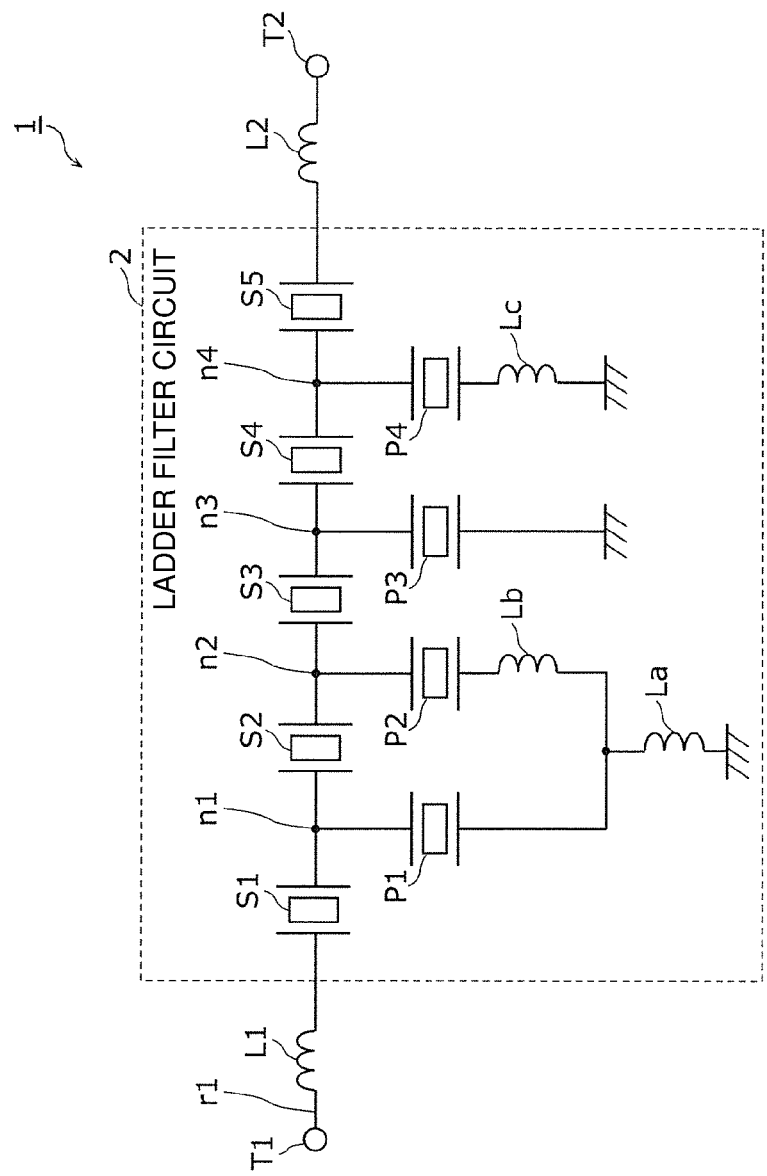
FIG. 3 is a circuit diagram of a filter according to Preferred Embodiment 1 of the present invention.

FIG. 3 is a circuit diagram of the filter 1 according to Preferred Embodiment 1. This preferred embodiment is described, by way of example, in connection with the filter 1 having a pass band (about 2496 MHz to about 2690 MHz) of Band41.

The filter 1 includes series resonators S1, S2, S3, S4 and S5 that are preferably acoustic wave resonators, parallel resonators P1, P2, P3 and P4 that are preferably acoustic wave resonators, a first inductor L1, a second inductor L2, and inductors La, Lb and Lc. In the following description, the wording "resonator(s)" is used to represent all or a portion of the series resonators S1 to S5 and the parallel resonators P1 to P4 in some cases.

The series resonators S1 to S5 are connected in series in the first path r1 interconnecting the first terminal T1 and the second terminal T2 in that order from the side near the first terminal T1. Among the series resonators S1 to S5 in the first path r1, the series resonator (first series resonator) S1 is closest to the first terminal T1, and the series resonator (fifth series resonator) S5 is closest to the second terminal T2. The series resonators S2 to S4 are disposed between the series resonator S1 and the series resonator S5.

The parallel resonators P1 to P4 are disposed in respective paths interconnecting nodes n1, n2, n3 and n4 between adjacent pairs of the series resonators S1 to S5 in the first path r1 and a reference terminal (ground), and they are connected in parallel to one another.

Thus, the filter 1 includes a ladder filter circuit 2 defined by the five series resonators S1 to S5 disposed in the first path r1, and by the four parallel resonators P1 to P4 disposed in the paths interconnecting the first path r1 and the reference terminal. The filter 1 further includes the first inductor L1 and the second inductor L2 that are connected in series to an input terminal and an output terminal of the ladder filter circuit 2, respectively.

The first inductor L1 is connected in series between the first terminal T1 and the series resonator S1. More specifically, the first inductor L1 is preferably directly connected to the first terminal T1 and the series resonator S1, but it is not directly connected to any of the series resonators S2 to S5 and the parallel resonators P1 to P4. An inductor value of the first inductor L1 is preferably about 4.9 nH, for example.

The second inductor L2 is connected in series between the series resonator S5 and the second terminal T2. More specifically, the second inductor L2 is preferably directly connected to the series resonator S5 and the second terminal T2, but it is not directly connected to any of the series resonators S1 to S4 and the parallel resonators P1 to P4. An inductor value of the second inductor L2 is preferably about 5.9 nH, for example.

An inductor La is connected between the parallel resonator P1 and the reference terminal. An inductor Lb is connected between the parallel resonator P2 and a node between the parallel resonator P1 and the inductor La. An inductor Lc is connected between the parallel resonator P4 and the reference terminal.

Thus, in the filter 1, a pass band width of the filter 1 is widened with the first inductor L1 and the second inductors L2 connected in series to the input terminal and the output terminal of the ladder filter circuit 2, respectively.

The filter 1 is not limited to the configuration including five series resonators, and may include a number n of series resonators (n is an integer of 3 or more). Furthermore, the filter 1 is not limited to the configuration including four parallel resonators, and may include one or more parallel resonators. Although the reference terminals to which the parallel resonators are connected are provided individually for some of the parallel resonators and commonly for the other parallel resonators in FIG. 3, whether to provide the reference terminals individually or commonly may be selected as appropriate in accordance with restrictions on a mount layout of the filter 1, and other factors.

A structure of the resonator defining the filter 1 will be described below. The resonator in the present preferred embodiment is preferably a SAW (Surface Acoustic Wave) resonator, for example.

Figure 4:
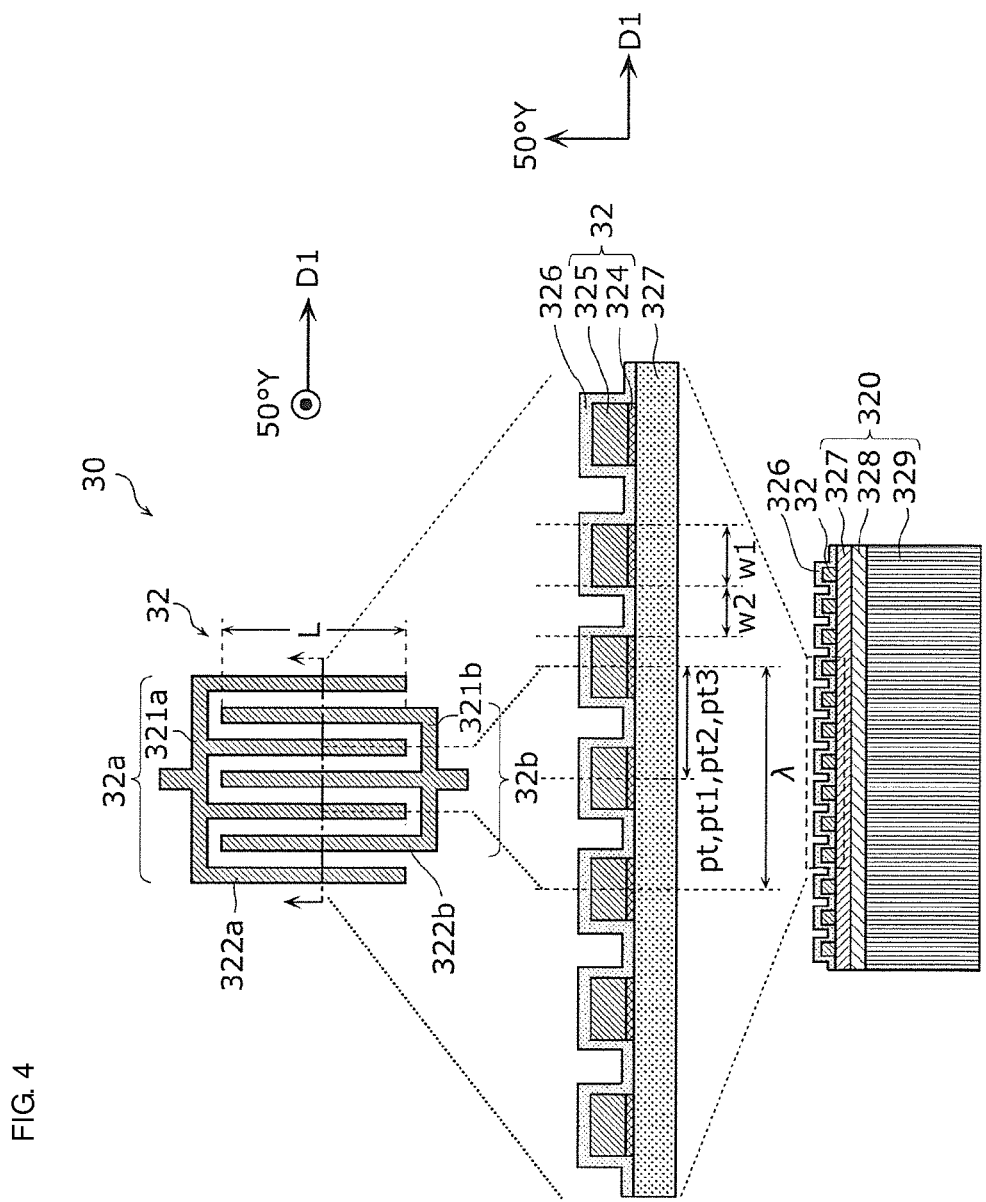
FIG. 4 shows a plan view and a sectional view schematically illustrating an acoustic wave resonator in the filter according to Preferred Embodiment 1 of the present invention.

FIG. 4 shows a plan view and a sectional view schematically illustrating the resonator in the filter 1. It is to be noted that the resonator illustrated in FIG. 4 is used to explain a typical structure of each resonator, and that the number and the length of electrode fingers defining an electrode are not limited to those illustrated.

As illustrated in the plan view of FIG. 4, the resonator includes a pair of comb-shaped electrodes 32a and 32b opposing each other, and a plurality of reflectors (not illustrated) disposed at positions appropriately spaced from the pair of comb-shaped electrodes 32a and 32b in an acoustic wave propagation direction D1. The pair of comb-shaped electrodes 32a and 32b defines an IDT (Interdigital Transducer) electrode 32.

The comb-shaped electrode 32a is defined by a plurality of electrode fingers 322a arranged parallel or substantially parallel to one another to define comb teeth, and a busbar electrode 321a interconnecting respective one ends of the electrode fingers 322a. The comb-shaped electrode 32b is defined by a plurality of electrode fingers 322b arranged parallel or substantially parallel to one another to define comb teeth, and a busbar electrode 321b interconnecting respective one ends of the electrode fingers 322b. The electrode fingers 322a and 322b extend in a direction perpendicular or substantially perpendicular to the acoustic wave propagation direction D1.

Electrode parameters of the IDT electrode 32 defining the resonator will be described below.

A wavelength of the resonator is specified by a wavelength $\lambda$, denoted in a middle zone of FIG. 4, which is a repletion period of the electrode fingers 322a or 322b defining the IDT electrode 32. A pitch pt of the electrode fingers 322a and 322b is preferably about ½ of the wavelength $\lambda$, for example. Where that a line width of each of the electrode fingers 322a and 322b defining the comb-shaped electrodes 32a and 32b is denoted by w1, and a space width between the electrode finger 322a and the electrode finger 322b adjacent to each other is denoted by w2, the pitch pt is defined by (w1+w2). An intersecting width L of the pair of comb-shaped electrodes 32a and 32b is denoted as an electrode finger length over which the electrode fingers 322a and 322b overlap each other when viewed from the acoustic wave propagation direction D1. Furthermore, an electrode duty of each resonator is an occupancy rate of the line widths of the electrode fingers 322a and 322b, i.e., a ratio of the line width to a value resulted from adding the line width of each of the electrode fingers 322a and 322b to the space width, and it is defined by w1/(w1+w2).

Table 1 lists details of the electrode parameters (wavelength $\lambda$, intersecting width L, pair number N, and electrode duty R) of the series resonators S1 to S5 and the parallel resonators P1 to P4, which constitute the filter 1 according to Preferred Embodiment 1.

TABLE 1

|  | Series Resonator S1 | Series Resonator S2 | Series Resonator S3 | Series Resonator S4 | Series Resonator S5 |
| --- | --- | --- | --- | --- | --- |
| Wavelength $\lambda$ (μm) | 1.3921 | 1.4413 | 1.4482 | 1.4393 | 1.3851 |
| Intersecting Width L (μm) | 27.9 | 28.8 | 28.9 | 28.8 | 28.0 |

TABLE 1-continued

| | | | | | |
|---|---|---|---|---|---|
| Pair Number N | 107 | 101 | 149 | 100 | 92 |
| Electrode Duty R | 0.5 | 0.5 | 0.5 | 0.5 | 0.5 |

| | Parallel Resonator P1 | Parallel Resonator P2 | Parallel Resonator P3 | Parallel Resonator P4 |
|---|---|---|---|---|
| Wavelength λ (μm) | 1.5376 | 1.5249 | 1.5324 | 1.5300 |
| Intersecting Width L (μm) | 30.8 | 30.6 | 30.7 | 30.6 |
| Pair Number N | 171 | 117 | 135 | 156 |
| Electrode Duty R | 0.5 | 0.5 | 0.5 | 0.5 |

Relationships among the individual resonators in the filter 1 according to the present preferred embodiment will be described below. In the following, the wording "electrode finger(s)" is used to represent all or a portion of the electrode fingers 322a and 322b.

An average pitch of the electrode fingers adjacent to each other in the acoustic wave propagation direction D1 in the series resonator S1 is referred to as a first pitch pt1. Furthermore, an average pitch of the electrode fingers adjacent to each other in the acoustic wave propagation direction D1 in each of the series resonators S2 to S4 other than the series resonator S1 and the series resonator S5 is referred to as a second pitch pt2. Moreover, an average pitch of the electrode fingers adjacent to each other in the acoustic wave propagation direction D1 in the series resonators S5 is referred to as a third pitch pt3. The term "average pitch" means a value resulting from dividing a distance between the electrode fingers, which are positioned at both ends of the IDT electrode 32 in the acoustic wave propagation direction D1, by (number of the electrode fingers–1).

The filter 1 according to the present preferred embodiment preferably satisfies the relationships of (first pitch pt1<second pitch pt2) and (third pitch pt3<second pitch pt2).

To express these relationships in terms of resonant frequency, a resonant frequency of the series resonator S1 is referred to as a first resonant frequency, a resonant frequency of each of the series resonators S2 to S4 other than the series resonator S1 and the series resonator S5 is referred to as a second resonant frequency, and a resonant frequency of the series resonator S5 is referred to as a third resonant frequency.

The filter 1 according to the present preferred embodiment preferably satisfies the relationships of (first resonant frequency>second resonant frequency) and (third resonant frequency>second resonant frequency).

In addition, the first pitch pt1 and the third pitch pt3 are each preferably, for example, not less than about 0.952 times and not more than about 0.98 times the second pitch pt2. The reason that the electrode fingers of the individual resonators in the filter 1 preferably satisfy the above-described relationships among the pitches pt1, pt2 and pt3 is described later.

A cross-sectional structure of the resonator will be described below with reference to FIG. 4.

As illustrated in the sectional view of FIG. 4, the IDT electrode 32 defined by the electrode fingers 322a and 322b and the bus bar electrodes 321a and 321b has a multilayer structure including a close contact layer 324 and a main electrode layer 325. A sectional structure of each reflector is similar to that of the IDT electrode 32.

The close contact layer 324 increases adhesion between a piezoelectric layer 327 and the main electrode layer 325. For example, Ti is preferably used as a material of the close contact layer 324. A film thickness of the close contact layer 324 is preferably about 12 nm, for example.

For example, Al including 1% of Cu is preferably used as a material of the main electrode layer 325. A film thickness of the main electrode layer 325 is preferably about 162 nm, for example.

A protective layer 326 is provided along outer surfaces of the IDT electrode 32 and a substrate 320 so as to cover the IDT electrode 32 and the substrate 320. The protective layer 326 protects the main electrode layer 325 from external environments, adjusts frequency-temperature characteristics, and improves moisture resistance. The protective layer 326 is preferably a film including silicon dioxide as a main ingredient, for example. A film thickness of the protective layer 326 is preferably about 25 nm, for example.

The above-described IDT electrode 32 is provided on a principal surface of the substrate 320 described below. A multilayer structure of the substrate 320 in the present preferred embodiment is as follows.

As illustrated in a lower zone of FIG. 4, the substrate 320 includes a high acoustic-velocity support substrate 329, a low acoustic-velocity film 328, and the piezoelectric layer 327. Thus, the substrate 320 has a structure in which the high acoustic-velocity support substrate 329, the low acoustic-velocity film 328, and the piezoelectric layer 327 are laminated in that order.

The piezoelectric layer 327 is preferably a piezoelectric film having a principal surface on which the IDT electrode 32 is disposed. The piezoelectric layer 327 is preferably made of, for example, a 50° Y cut X SAW propagation LiTaO$_3$ piezoelectric single crystal or piezoelectric ceramic (i.e., a lithium tantalate single crystal obtained by cutting the single crystal along a plane having a normal line that is given by an axis rotated through about 50° from a Y axis with an X axis being a center axis or the ceramic, the single crystal or the ceramic allowing a surface acoustic wave to propagate in a direction of the X axis). A film thickness of the piezoelectric layer 327 is preferably not more than about 3.5λ where a wavelength of the acoustic wave being denoted by λ, and is more preferably about 600 nm, for example.

The high acoustic-velocity support substrate 329 supports the low acoustic-velocity film 328, the piezoelectric layer 327, and the IDT electrode 32. More specifically, a bulk wave inside the high acoustic-velocity support substrate 329 has a higher acoustic velocity than acoustic waves, i.e., a surface acoustic wave and a boundary acoustic wave, propagating in the piezoelectric layer 327. The high acoustic-velocity support substrate 329 confines the surface acoustic wave in a portion in which the piezoelectric layer 327 and the low acoustic-velocity film 328 are laminated, and prevents the surface acoustic wave from leaking to the lower side than the high acoustic-velocity support substrate 329. The high acoustic-velocity support substrate 329 is preferably a silicon substrate, for example, and preferably has a thickness of about 125 μm, for example.

A bulk wave inside the low acoustic-velocity film 328 has a lower acoustic velocity than the acoustic waves propagating in the piezoelectric layer 327. The low acoustic-velocity film 328 is disposed between the piezoelectric layer 327 and the high acoustic-velocity support substrate 329. Energy of the surface acoustic wave is reduced or prevented from leaking to the outside of the IDT electrode 32 due to not only the above-described structure, but also such intrinsic properties of an acoustic wave that energy of the acoustic wave tends to concentrate in a medium having a relatively low acoustic velocity. The low acoustic-velocity film 328 preferably includes, for example, silicon dioxide as a main ingredient. A thickness of the low acoustic-velocity film 328 is preferably not more than about 2λ where the wavelength of the acoustic wave is denoted by λ, and is more preferably about 670 nm, for example.

With the above-described multilayer structure of the substrate 320 in the present preferred embodiment, Q-values at the resonant frequency and the anti-resonant frequency are increased to a larger extent than those obtained with a structure in which the piezoelectric substrate is made of a single layer. With the above-described multilayer structure, however, because the energy of the acoustic wave is confined with higher efficiency in a thickness direction of the substrate 320, the spurious resonance at a frequency different from the resonant frequency is less attenuated and is more likely to remain. Accordingly, a measure to further reduce or prevent the spurious resonance is required in the resonator in the present preferred embodiment and having the above-described multilayer structure.

In the present preferred embodiment, as described above, the first inductor L1 and the second inductors L2 are connected in series to the input terminal and the output terminal of the ladder filter circuit 2, respectively. Furthermore, regarding the pitches pt of the electrode fingers of the individual resonators, the relationships of (first pitch pt1<second pitch pt2) and (third pitch pt3<second pitch pt2) are satisfied. With those features, it is possible to widen the pass band width of the filter 1, to reduce or prevent the spurious resonance that may generate at the frequency different from the resonant frequency, and to increase the attenuation outside the pass band.

Figure 5A:
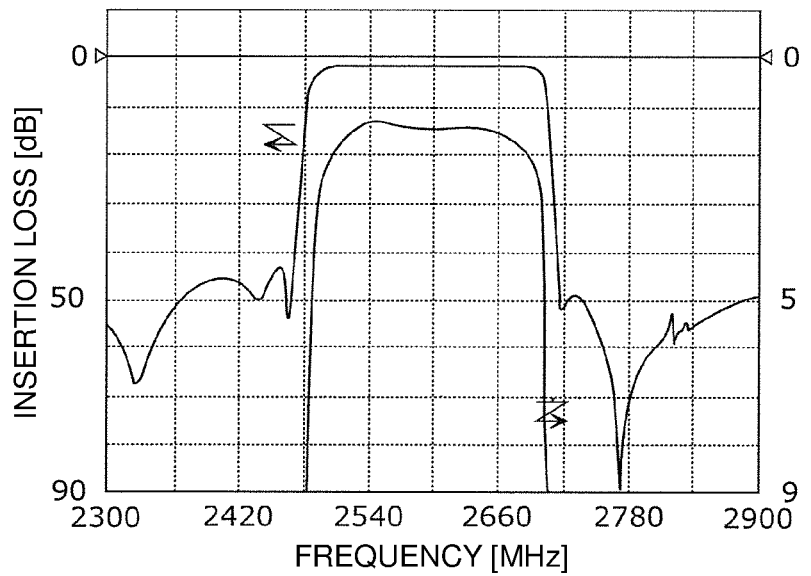
FIGS. 5A and 5B are each a graph representing transfer characteristics of the filter according to Preferred Embodiment 1 of the present invention.
Figure 5B:
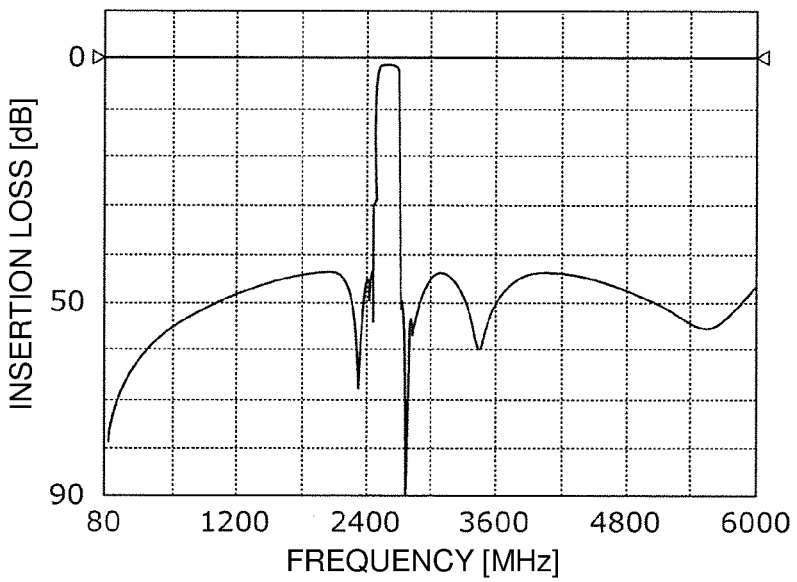

Advantageous effects of the filter 1 having the above-described structure and configuration will be described below with reference to FIGS. 5A and 5B. FIGS. 5A and 5B are each a graph representing transfer characteristics of the filter 1, and they represent an example in which the filter 1 is used as a filter for Band41.

As illustrated in FIG. 5A, the filter 1 has a pass band width that is wide enough to enable application of the filter 1 to Band41 (pass band: about 2496 MHz to about 2690 MHz). Furthermore, as illustrated in FIG. 5B, attenuations of the filter 1 in frequency bands of Band3 (Tx: about 1710 to about 1785 MHz, Rx: about 1805 to about 1880 MHz) and Band25 (Tx: about 1850 to about 1915 MHz, Rx: 1930 to 1995 MHz) are preferably not less than about 44 dB, for example. Thus, the attenuations in Band3 and Band25 are greater than those in the filter 501 according to Comparative Example 1. In other words, the attenuation outside the pass band is increased by using the filter 1 according to the present preferred embodiment.

The reason that the pass band width is able to be widened and the attenuation outside the pass band is able to be increased in the filter 1 according to the present preferred embodiment will be described below with reference to FIGS. 6A and 6B.

Figure 6A:
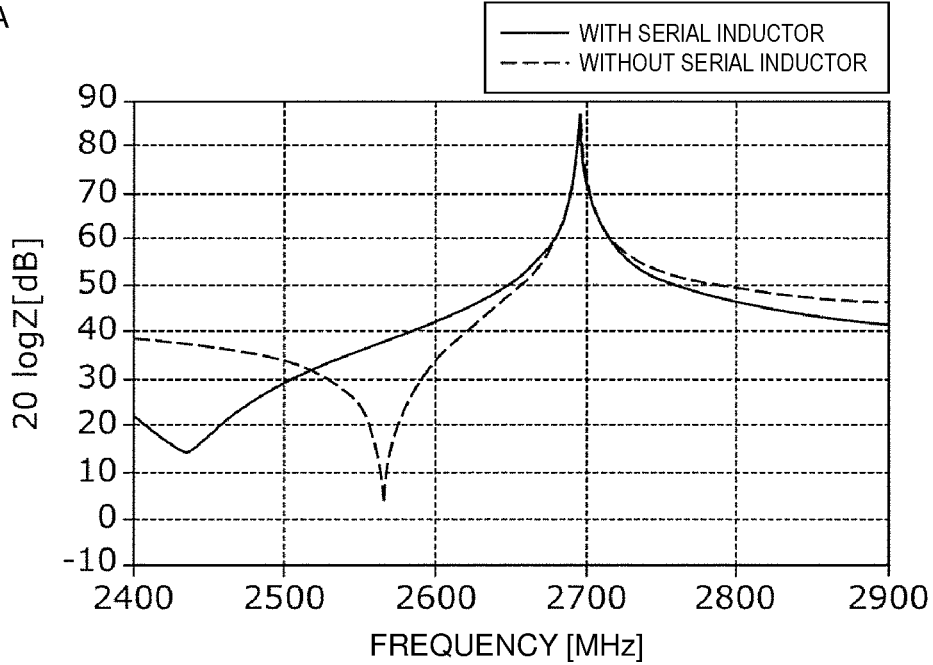
FIGS. 6A and 6B are each a graph representing change in impedance of a series resonator in Preferred Embodiment 1 of the present invention.
Figure 6B:
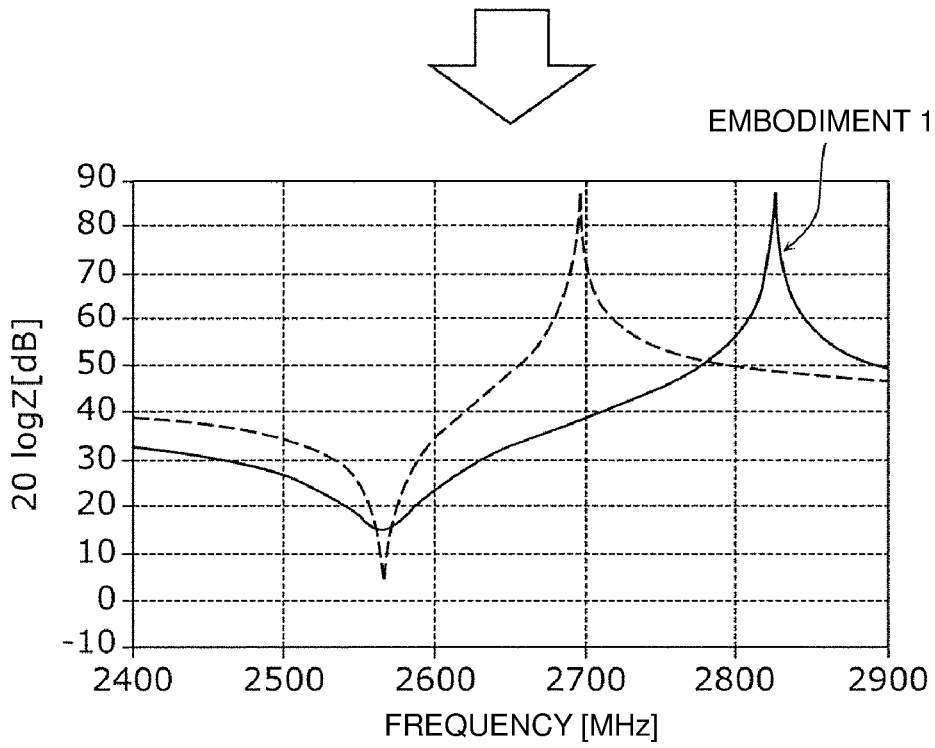

FIGS. 6A and 6B are each a graph representing change in impedance of the series resonator S1. A solid line in FIG. 6A represents the impedance of the series resonator S1 to which the inductor L1 is connected in series, and a dotted line represents the impedance of the series resonator S1 on an assumption that the inductor L1 is not connected.

As illustrated in FIG. 6A, by connecting the inductor L1 in series to the series resonator S1, the resonant frequency of the series resonator S1 is lowered, and the frequency interval between the resonant frequency and the anti-resonant frequency is widened. Thus, the pass band width of the filter 1 is widened.

From another point of view, because the resonant frequency of the series resonator S1 is lowered by connecting the inductor in series to the series resonator S1 as illustrated in FIG. 6A, the resonant frequency having been shifted to the lower frequency side needs to be adjusted to fall within the pass band. The resonant frequency is able to be adjusted depending on the pitch pt of the electrode fingers in the IDT electrode 32.

A solid line in FIG. 6B represents the impedance of the series resonator S1 when the first pitch pt1 of the series resonator S1 is set to be smaller than the second pitch pt2 of each of the other series resonators S2 to S4. A dotted line in FIG. 6B represents the impedance of the series resonator S1 when the first pitch pt1 of the series resonator S1 is set to be equal or substantially equal to the second pitch pt2 of each of the other series resonators S2 to S4.

As illustrated in FIG. 6B, by setting the first pitch pt1 to be smaller than the second pitch pt2, the wavelength λ of the series resonator S1 is shortened, and the resonant frequency of the series resonator S1 having been shifted to the lower frequency side is increased. With the frequency adjustment, the resonant frequency of the series resonator S1 is able to be adjusted to within the pass band, thus enabling the series resonator S1 to define and function as an element that defines the pass band of the filter 1. In addition, the impedance of the series resonator S1 in Preferred Embodiment 1 is free from the spurious resonance that is generated in Comparative Example 1. As a result, a sufficient attenuation is ensured outside the pass band of the filter 1.

As described above, the pass band width of the filter 1 is able to be widened by connecting the inductor L1 in series to the ladder filter circuit 2. Furthermore, by setting the first pitch pt1 of the series resonator S1, which is positioned adjacent to the inductor L1, to be relatively small, the resonant frequency is adjusted to fall within a desired frequency band, and the sufficient attenuation is ensured outside the pass band. While the above description is provided regarding the inductor L1 positioned on the side closer to the first terminal T1, the above point is similarly applied to the inductor L2 positioned on the side closer to the second terminal T2. More specifically, the pass band width of the filter 1 is able to be widened by connecting the inductor L2 in series to the ladder filter circuit 2. Furthermore, by setting the third pitch pt3 of the series resonator S5, which is positioned adjacent to the inductor L2, to be relatively small, the resonant frequency is adjusted to fall within a desired frequency band, and the sufficient attenuation is ensured outside the pass band.

The amount by which the first pitch pt1 is preferably reduced, namely a desired range of the first pitch pt1, will be described below with reference to FIGS. 7A and 7B.

Figure 7A:
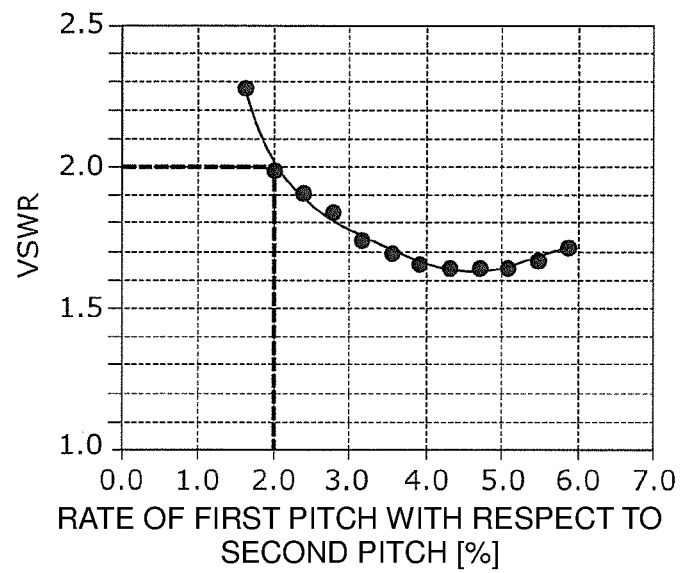
FIG. 7A is a graph representing VSWR (Voltage Standing Wave Ratio) in a pass band of the filter according to Preferred Embodiment 1 of the present invention.
Figure 7B:
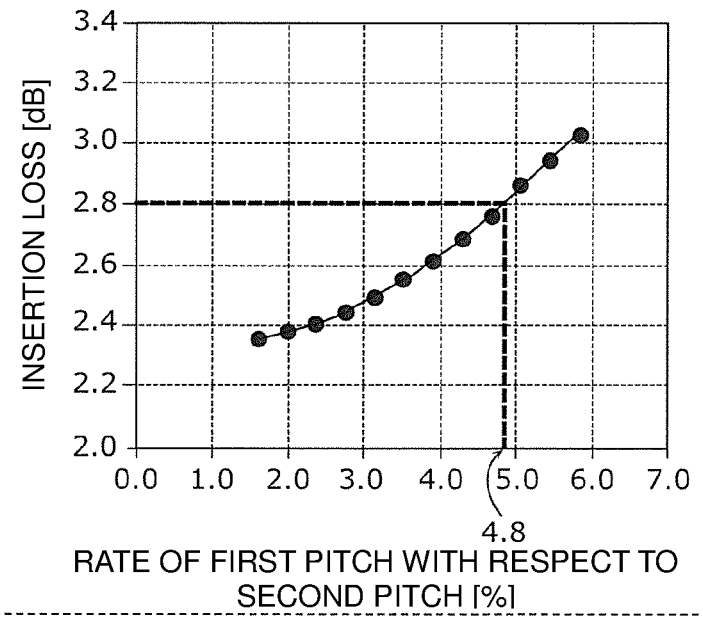
FIG. 7B is a graph representing an insertion loss in the pass band of the relevant filter.

FIG. 7A is a graph representing VSWR (Voltage Standing Wave Ratio) in the pass band of the filter 1, and FIG. 7B is a graph representing an insertion loss in the pass band of the filter 1. A rate of the first pitch pt1 with respect to the second pitch pt2, denoted by a horizontal axis, is provided as a value obtained from a formula of rate (%)=(pt2−pt1)/pt2×100. FIGS. 7A and 7B are illustrated based on the second pitch pt2. In each of FIGS. 7A and 7B, the first pitch pt1 reduces toward the positive direction of the horizontal axis.

In FIG. 7A, VSWR reduces as the rate increases along the horizontal axis, namely as the first pitch pt1 is set to a smaller value as compared to the second pitch pt2. As seen from FIG. 7A, VSWR is able to be maintained to not more than about 2 by setting the rate to be not less than about 2.0%, for example. In other words, VSWR is able to be maintained to not more than about 2 by setting the first pitch pt1 to be not more than about 0.98 times the second pitch pt2. Thus, an impedance mismatch in the pass band of the filter 1 is reduced by setting the first pitch pt1 to fall within the above-described range.

In FIG. 7B, the insertion loss increases as the rate increases along the horizontal axis, namely as the first pitch pt1 is set to a smaller value as compared to the second pitch pt2. The reason that the insertion loss increases is because, when the resonant frequency of the series resonator S1 is too high as a result of reducing the first pitch pt1, the inductor value of the inductor L1 is increased in order to return the resonant frequency to the original frequency. Because the inductor L1 has a resistance component, the insertion loss of the filter 1 increases as the inductor value increases. This implies that the first pitch pt1 is not just required to be as small as possible, but that there is an upper limit on the first pitch pt1. As seen from FIG. 7B, the insertion loss of the filter 1 is able to be maintained to not more than about 2.8 dB by setting the rate to be not more than about 4.8%, for example. In other words, the insertion loss is able to be maintained to not more than about 2.8 dB by setting the first pitch pt1 to be not less than about 0.952 times the second pitch pt2. Thus, the insertion loss in the pass band of the filter 1 is reduced by setting the first pitch pt1 to fall within the above-described range.

The desired number of series resonators in the filter 1 will be described below with reference to FIG. 8.

Figure 8:
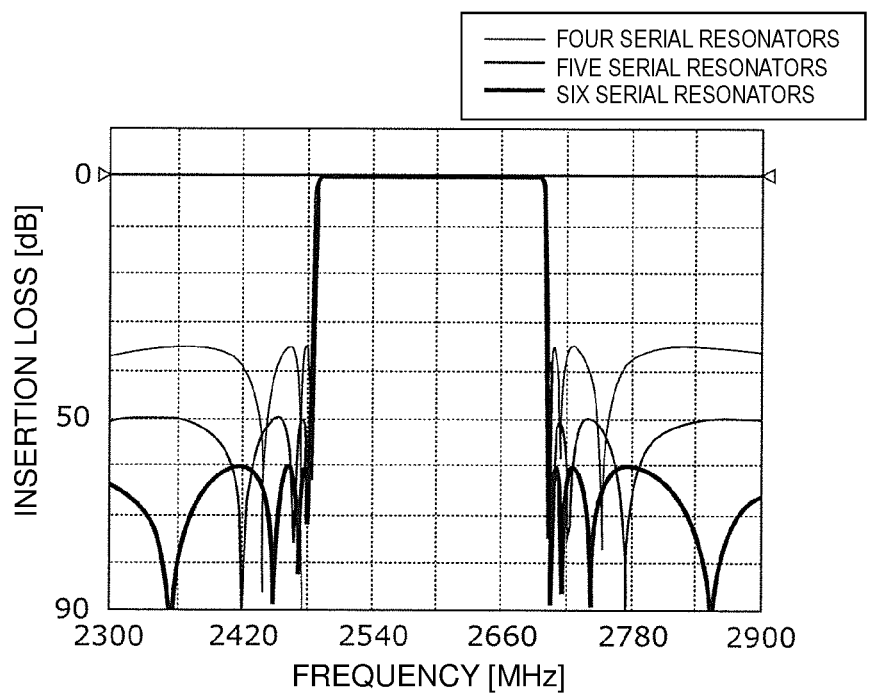
FIG. 8 is a graph representing an insertion loss when the number of series resonators is changed on the condition of taking an elliptic function filter as a model.

FIG. 8 is a graph representing an insertion loss when the number of series resonators is changed, the insertion loss being calculated by simulation of an elliptic function filter. In FIG. 8, the simulation is conducted while the number of series resonators in a ladder filter is changed from four to six step by step. It is to be noted that, in FIG. 8, the number of parallel resonators is also increased or decreased correspondingly to the number of series resonators.

As illustrated in FIG. 8, as the number of series resonators in the ladder filter increases, the attenuation outside the pass band increases. For instance, when the number of series resonators is four, the attenuation of about 35 dB is obtained, and when the number of series resonators is five, the attenuation of not less than about 40 dB is obtained. Thus, when the attenuation of not less than about 40 dB outside the pass band is required, the attenuation at a sufficient level is able to be obtained by setting the number of series resonators in the filter 1 to be five or more.

The filter 1 according to the present preferred embodiment includes the first terminal T1, the second terminal T2, the series resonators S1 to S5 that are disposed in series in the first path r1 interconnecting the first terminal T1 and the second terminal T2, the parallel resonators P1 and P4 that are disposed in the paths interconnecting respectively the nodes n1 to n4 between adjacent pairs of the series resonators S1 to S5 in the first path r1 and the ground, the first inductor L1 that is disposed in the first path r1 between the first terminal T1 and the series resonator S1, i.e., one of the series resonators S1 to S5 closest to the first terminal T1, and the second inductor L2 that is disposed in the first path r1 between the second terminal T2 and the series resonator S5, i.e., one of the series resonators S1 to S5 closest to the second terminal T2.

Where the resonant frequency of the series resonator S1 is referred to as the first resonant frequency, the resonant frequency of each of the series resonators S2 to S4 other than the series resonator S1 and the series resonator S5 is referred to as the second resonant frequency, and the resonant frequency of the series resonator S5 is referred to as the third resonant frequency, the first resonant frequency and the third resonant frequency are each preferably higher than the second resonant frequency.

By satisfying the above-described relationship in terms of resonant frequency, the filter 1 according to Preferred Embodiment 1 is able to widen the pass band width of the filter 1, to reduce or prevent the spurious resonance that may generate at the frequency different from the resonant frequency, and to increase the attenuation outside the pass band.

Furthermore, each of the series resonators S1 to S5 and the parallel resonators P1 and P4 in the filter 1 includes the IDT electrode 32 that is provided on the substrate 320 having piezoelectricity, and the IDT electrode 32 includes the electrode fingers 322a and 322b that extend in the direction perpendicular or substantially perpendicular to the acoustic wave propagation direction D1.

Where the average pitch of the electrode fingers 322a and 322b adjacent to each other in the acoustic wave propagation direction D1 in the series resonator S1 is referred to as the first pitch pt1, the average pitch of the electrode fingers 322a and 322b adjacent to each other in the acoustic wave propagation direction D1 in each of the series resonators S2 to S4 other than the series resonator S1 and the series resonator S5 is referred to as the second pitch pt2, and the average pitch of the electrode fingers 322a and 322b adjacent to each other in the acoustic wave propagation direction D1 in the series resonators S5 is referred to as the third pitch pt3, the first pitch pt1 and the third pitch pt3 are each preferably smaller than the second pitch pt2.

By satisfying the above-described relationships of the pitches of the electrode fingers, the filter 1 according to Preferred Embodiment 1 is able to widen the pass band width of the filter 1, to reduce or prevent the spurious resonance that may be generated at the frequency different from the resonant frequency, and to increase the attenuation outside the pass band.

Preferred Embodiment 2

Figure 9:
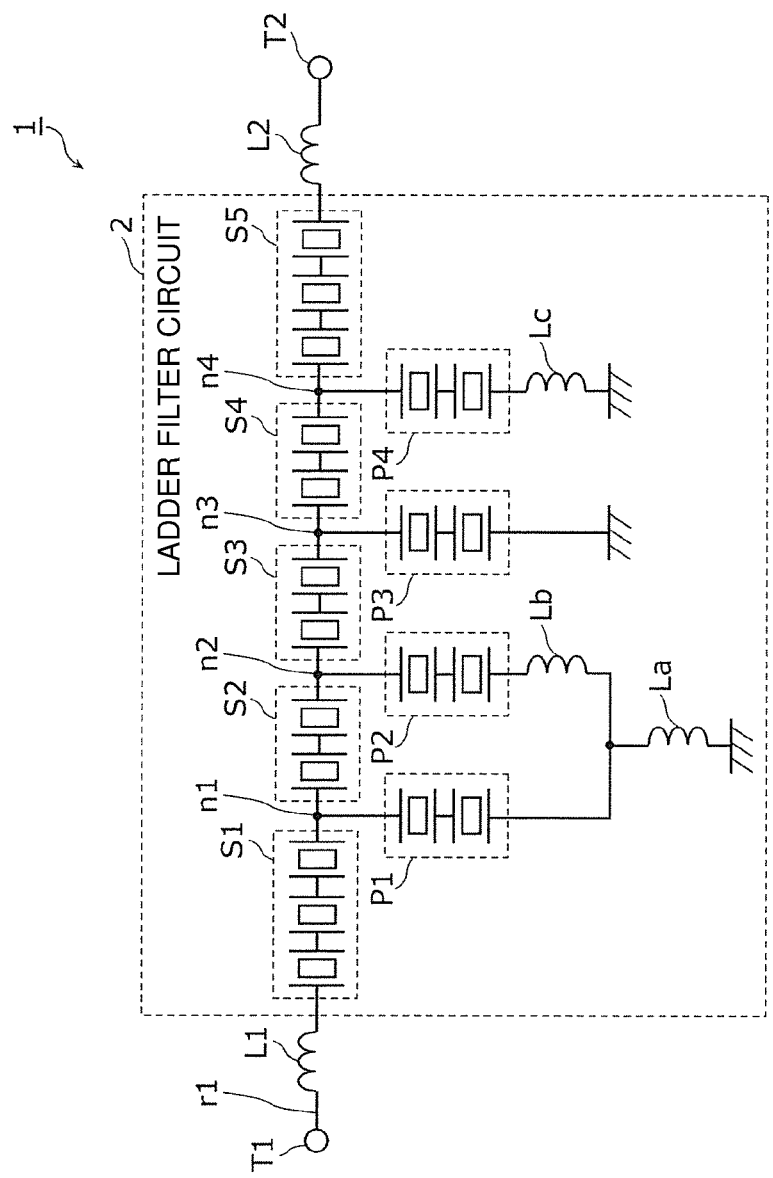
FIG. 9 is a circuit diagram of a filter according to Preferred Embodiment 2 of the present invention.

FIG. 9 is a circuit diagram of a filter 1 according to Preferred Embodiment 2 of the present invention. As in the filter 1 according to Preferred Embodiment 1, the filter 1 according to Preferred Embodiment 2 also includes series resonators S1, S2, S3, S4 and S5, parallel resonators P1, P2, P3 and P4, a first inductor L1, a second inductor L2, and inductors La, Lb and Lc.

In the filter 1 according to Preferred Embodiment 2, capacitances of the series resonators S1 and S5 are set to be smaller than those of the series resonators S2 to S4. The attenuation of the filter 1 is able to be increased by setting the capacitances of the series resonators S1 and S5 to be relatively small. It is more preferable to reduce the capacitances of the series resonators S1 and S5, which are positioned closer to the inductances L1 and L2, than to reduce the capacitances of the series resonators S2 to S4. That point will be described later.

In the filter 1 according to Preferred Embodiment 2, as illustrated in FIG. 9, the series resonators S1 to S5 and the parallel resonators P1 and P4 are each defined by divided resonators. More specifically, the series resonators S1 and S5 are each defined by three resonators disposed in series, and the series resonators S2 to S4 are each defined by two resonators disposed in series. In other words, the division number in each of the series resonators S1 and S5 is greater than that in each of the series resonators S2 to S4. Additionally, the parallel resonators P1 and P4 are each divided in the same division number.

The reason that the division number of the series resonators S1 and S5 is set to be greater than that of the series resonators S2 to S4 is attributable to the feature that the capacitances of the series resonators S1 and S5 are set to be smaller than those of the series resonators S2 to S4. For instance, if the capacitance of a resonator is small, a ripple is more likely to be generated at the lower frequency side than the resonant frequency. When a ripple generates in the resonator, a pass band ripple within the pass band of the filter and an intermodulation distortion may be generated. Moreover, when the capacitance of the resonator is small, the electric power handling capability of the filter is reduced. On the other hand, by dividing the resonator into a plurality of resonators and then connecting the divided resonators in series as described above, a circuit is able to be designed such that the capacitance of the resonators after being divided has a greater value than the capacitance of the resonator before being divided.

Thus, the ripple and other disturbances which may become more likely to be generated as a result of reducing the capacitances of the series resonators S1 and S5, are able to be reduced or prevented by setting the division number in each of the series resonators S1 and S5 to be relatively large in the filter 1.

Table 2 lists details of the electrode parameters (pair number N, intersecting width L, division number, and capacitance comparison value) of the series resonators S1 to S5 and the parallel resonators P1 to P4, which define the filter 1 according to Preferred Embodiment 2. The capacitance comparison value represents a value obtained from a formula of (capacitance comparison value=pair number× intersecting width/division number). Additionally, the capacitance comparison value represents the value before dividing the resonator, and the pair number N represents the number of pairs after dividing the resonator.

The reasons that it is preferable to reduce the capacitances of the series resonators S1 and S5 among the series resonators S1 to S5 will be described below.

In Preferred Embodiment 1, changing the capacitances of the series resonators S1 and S5, which are positioned closer to the inductances L1 and L2, is able to more easily achieve impedance matching by adjusting values of the inductances L1 and L2, and to reduce the insertion loss due to a mismatch than changing the capacitances of the series resonators S2 to S4.

In Preferred Embodiment 2, an influence exerted on the pass band width by changing the capacitances of the series resonators S1 and S5 is small, while the pass band width is narrowed, though slightly, by changing the capacitances of the series resonators S2 to S4. This point will be described below with reference to FIGS. 10A and 10B to 13.

Figure 10A:
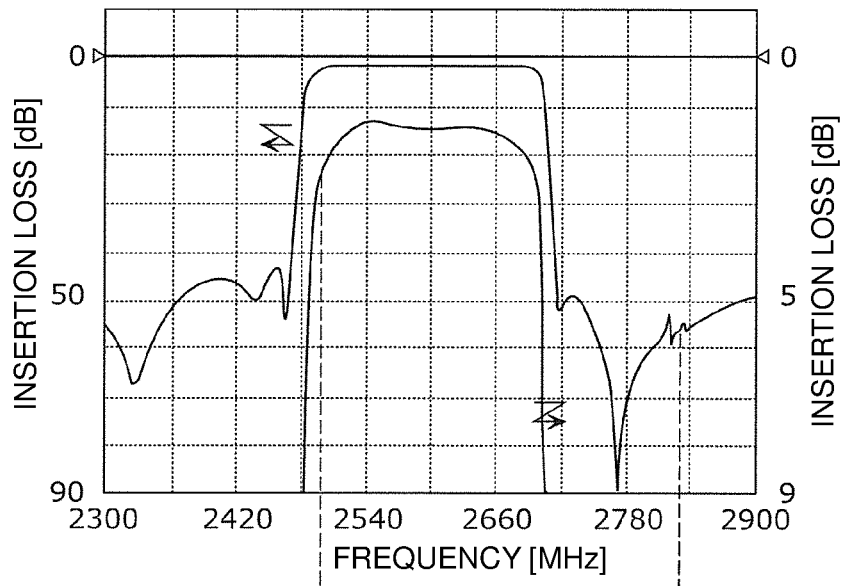
FIGS. 10A and 10B are graphs representing a relationship between transfer characteristics of the filter and an impedance of a series resonator.
Figure 10B:
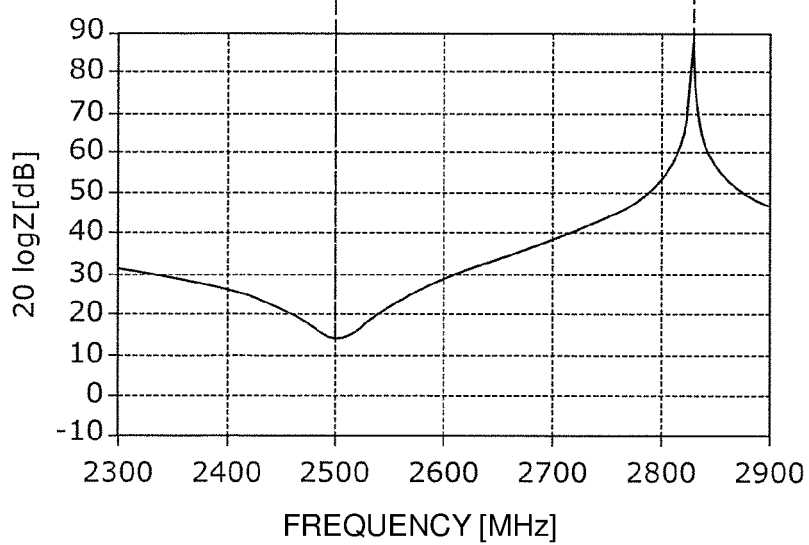

FIGS. 10A and 10B are graphs representing a relationship between transfer characteristics of the filter 1 and an impedance of the series resonator S1. As illustrated in FIGS. 10A and 10B, the resonant frequency of the series resonator S1 is positioned in a slope region of the pass band of the filter 1 at the lower frequency side. The anti-resonant frequency of the series resonator S1 is positioned outside the pass band at the higher frequency side of the pass band.

A pass band width of a ladder filter is determined depending on inductive properties of a parallel resonator and capacitive properties of a series resonator at the lower frequency side of the pass band, and is determined depending on capacitive properties of the parallel resonator and inductive properties of the series resonator at the higher frequency side of the pass band.

As illustrated in FIG. 10B, in the case of the resonant frequency of the series resonator S1 being positioned at the lower frequency side of the pass band, a change of a capacitive value of the series resonator S1 is small even when the capacitance of the series resonator S1 is reduced. Moreover, in the case of the anti-resonant frequency of the series resonator S1 being positioned at the higher frequency side of the pass band in a region outside the pass band, a change of an inductive value of the series resonator S1 is small even when the capacitance of the series resonator S1 is reduced. Thus, in the series resonator S1 having the resonant frequency positioned in the slope region of the pass band at the lower frequency side and having the anti-resonant frequency positioned outside the pass band, the influence exerted on the pass band width of the filter 1 is small even when the capacitance of the series resonator S1 is reduced.

Figure 11:
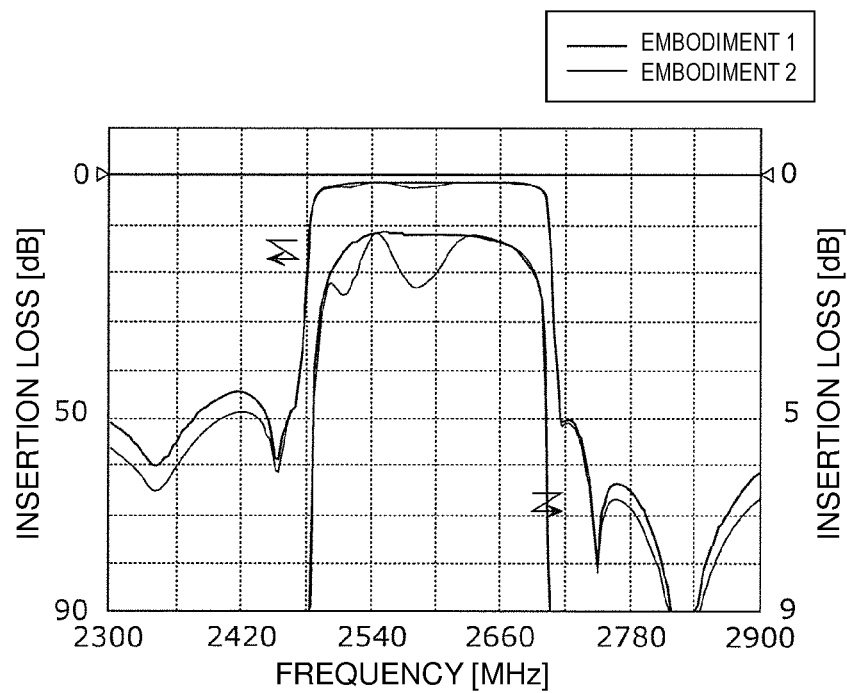
FIG. 11 is a graph representing transfer characteristics of the filters according to Preferred Embodiment 1 and Preferred Embodiment 2 of the present invention.

FIG. 11 is a graph representing transfer characteristics of the filters 1 according to Preferred Embodiment 1 and Preferred Embodiment 2. In FIG. 11, a thick solid line represents the transfer characteristics of the filter 1 according to Preferred Embodiment 1, and a thin solid line repre-

TABLE 2

| | Series Resonator S1 | Series Resonator S2 | Series Resonator S3 | Series Resonator S4 | Series Resonator S5 |
|---|---|---|---|---|---|
| Pair Number N | 107 | 101 | 149 | 100 | 92 |
| Intersecting Width L (μm) | 27.9 | 28.8 | 28.9 | 28.8 | 28.0 |
| Division Number | 3 | 2 | 2 | 2 | 3 |
| Capacitance Comparison Value*) | 995 | 1454 | 2153 | 1440 | 859 |

*)(Pair Number × Intersecting Width/Division Number)

sents the transfer characteristics of the filter 1 according to Preferred Embodiment 2. The filter 1 according to Preferred Embodiment 2 generates ripples in a portion of the pass band as compared to the filter 1 according to Preferred Embodiment 1, but the pass band width is hardly changed in both the filters. Thus, by reducing the capacitance of the series resonator S1 in the filter 1, the attenuation outside the pass band is able to be increased in the state in which the influence exerted on the pass band width is reduced. The above discussion is similarly applied to the series resonator S5. In other words, by reducing the capacitance of the series resonator S5, the attenuation outside the pass band is able to be increased in the state in which the influence exerted on the pass band width is reduced.

Figure 12A:
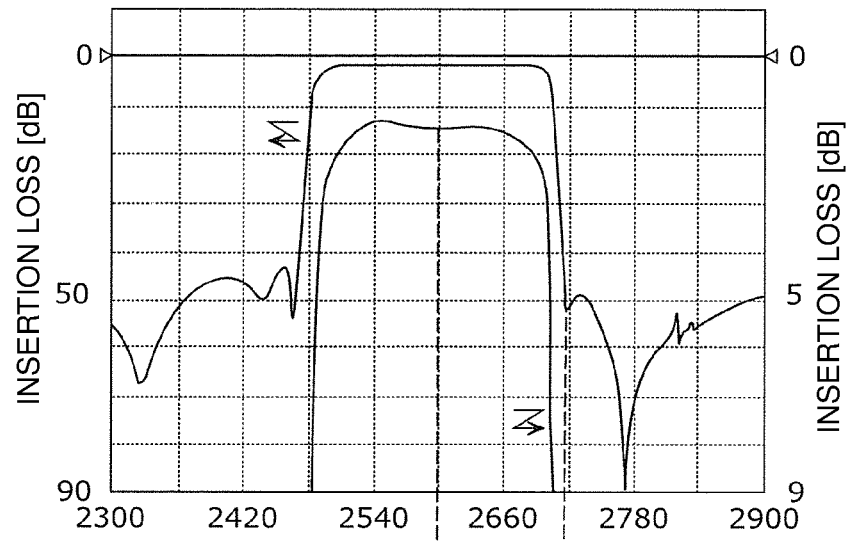
FIGS. 12A and 12B are graphs representing a relationship between transfer characteristics of a filter and an impedance of a series resonator arranged at a center in Comparative Example 2.
Figure 12B:
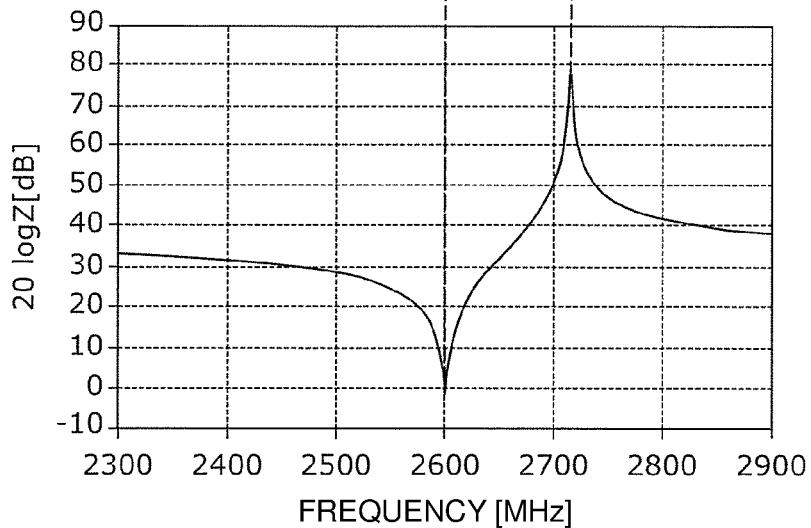

Comparative Example 2 will be described below with reference to FIGS. 12A and 12b. FIGS. 12A and 12B are graphs representing a relationship between transfer characteristics of a filter and an impedance of the series resonator S3 arranged at a center in Comparative Example 2.

As illustrated in FIGS. 12A and 12B, the resonant frequency of the series resonator S3 is positioned in a central region of the pass band of the filter. Furthermore, the anti-resonant frequency of the series resonator S3 is positioned in a slope region of the pass band at the higher frequency side.

As illustrated in FIG. 12B, in the case of the resonant frequency of the series resonator S3 being positioned in the central region of the pass band, when the capacitance of the series resonator S3 is reduced, the capacitive value at the lower frequency side of the pass band is reduced to a smaller value than when the capacitance of the series resonator S1 is reduced, and a frequency in the slope region of the pass band at the lower frequency side is shifted toward the higher frequency side. Moreover, in the case of the anti-resonant frequency of the series resonator S3 being positioned in the slope region of the pass band at the higher frequency side, when the capacitance of the series resonator S3 is reduced, the inductive value at the higher frequency side of the pass band is increased to a greater value than when the capacitance of the series resonator S1 is reduced, and a frequency in the slope region of the pass band at the higher frequency side is shifted toward the lower frequency side. Thus, in the series resonator S3 having the resonant frequency positioned in the central region of the pass band and having the anti-resonant frequency positioned in the slope region of the pass band at the higher frequency side, the pass band width of the filter is narrowed when the capacitance of the series resonator S3 is reduced.

Figure 13:
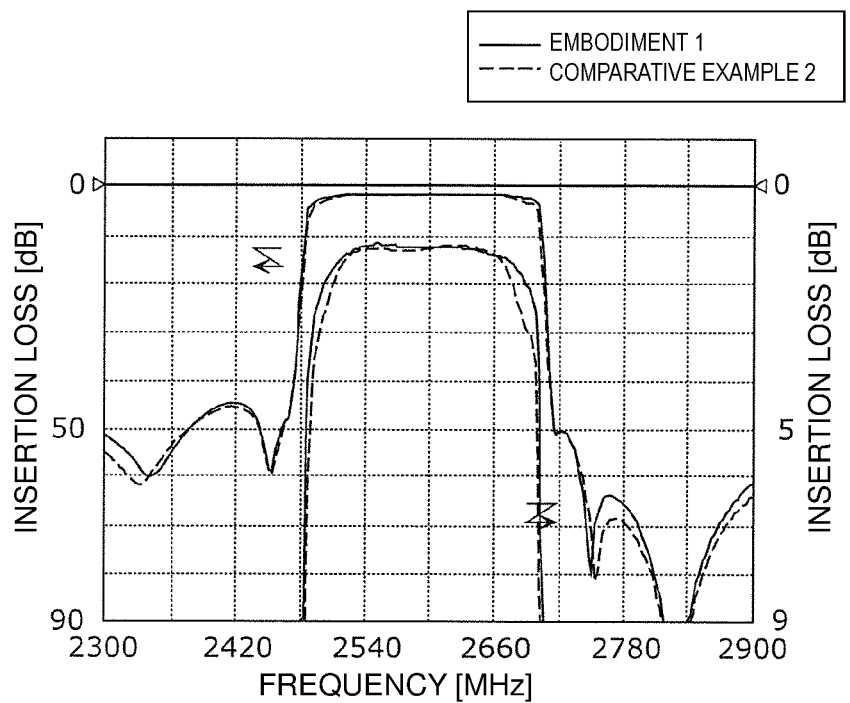
FIG. 13 is a graph representing the transfer characteristics of the filter according to Preferred Embodiment 1 of the present invention and the filter according to Comparative Example 2.

FIG. 13 is a graph representing transfer characteristics of the filter 1 according to Preferred Embodiment 1 and the filter according to Comparative Example 2. In FIG. 13, a solid line represents the transfer characteristics of the filter 1 according to Preferred Embodiment 1, and a dotted line represents the transfer characteristics of the filter according to Comparative Example 2. The pass band is narrowed in the filter according to Comparative Example 2 as compared to the filter 1 according to Preferred Embodiment 1. Thus, in order to achieve a filter having a wider pass band width and providing a larger attenuation, it is preferable to adjust the capacitances of the series resonators S1 and S5, which are positioned respectively close to the inductor L1 and the inductor L2, to be smaller than those of the other series resonators S2 to S4.

Also in the filter 1 according to Preferred Embodiment 2, the first inductor L1 and the second inductors L2 are connected in series to the input terminal and the output terminal of the ladder filter circuit 2, respectively. Furthermore, regarding the pitches pt of the electrode fingers of the individual resonators, the relationships of (first pitch pt1<second pitch pt2) and (third pitch pt3<second pitch pt2) are satisfied. With these features, it is possible to widen the pass band width of the filter 1, to reduce or prevent the spurious resonance that may be generate at the frequency different from the resonant frequency, and to increase the attenuation outside the pass band.

When the series resonators S1 to S5 are each defined by a plurality of divided IDT electrodes, the average pitch pt is able to be obtained, as a weighted average value, by weighting each of average pitches pt, which have been determined respectively for the divided IDT electrodes, with the number of the electrode fingers per IDT electrode.

Preferred Embodiment 3

An acoustic wave resonator 101 according to Preferred Embodiment 3 of the present invention will be described below with reference to FIG. 14. The acoustic wave resonator 101 in Preferred Embodiment 3 is different from the acoustic wave resonator in Preferred Embodiment 1, which utilizes a surface acoustic wave, in that the acoustic wave resonator 101 is a piezoelectric thin film resonator utilizing thickness longitudinal vibration of a bulk wave.

Figure 14:
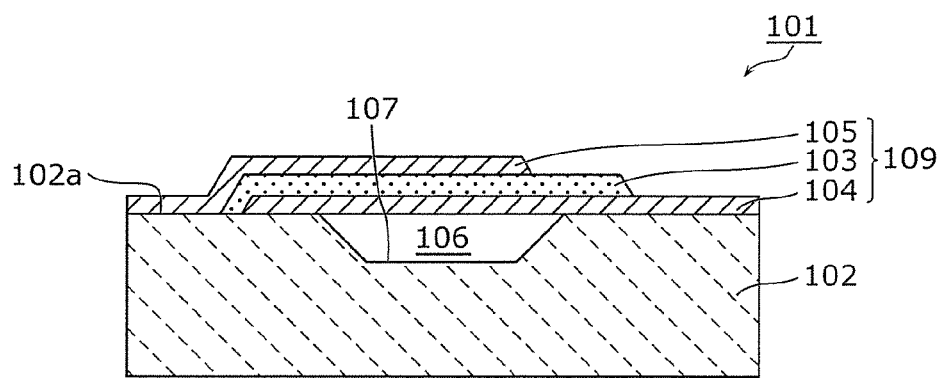
FIG. 14 is a sectional view of an acoustic wave resonator in a filter according to Preferred Embodiment 3 of the present invention.

FIG. 14 is a sectional view of the acoustic wave resonator 101 in a filter according to Preferred Embodiment 3.

The acoustic wave resonator 101 includes a substrate 102, and a thin-film multilayer portion 109 disposed on the substrate 102. The thin-film multilayer portion 109 includes a piezoelectric layer 103, a first side electrode layer 104, and a second side electrode layer 105. In the acoustic wave resonator 101, a resonant frequency is able to be changed by changing a thickness of the first side electrode layer 104 or the second side electrode layer 105.

The substrate 102 is preferably an insulator or a semiconductor, such as, for example, a silicon substrate. A recessed surface 107 defining a cavity 106 is provided in a portion of a first principal surface 102a of the substrate 102.

One portion of the thin-film multilayer portion 109 is fixed to the first principal surface 102a of the substrate 102. Another portion of the thin-film multilayer portion 109, that portion not being fixed to the first principal surface 102a, is spaced away from the recessed surface 107 and is maintained in a floating state with the cavity 106 interposed therebetween. The other portion of the thin-film multilayer portion 109, spaced away from the recessed surface 107 and not contacting the substrate 102, is acoustically separated from the substrate 102.

The piezoelectric layer 103 of the thin-film multilayer portion 109 is preferably made of, for example, an aluminum nitride film including scandium. The piezoelectric layer 103 is formed, for example, by doping scandium into an aluminum nitride film. The first side electrode layer 104 is provided at a lower surface of the piezoelectric layer 103. The second side electrode layer 105 is provided at an upper surface of the piezoelectric layer 103. The first side electrode layer 104 overlaps the second side electrode layer 105 with the piezoelectric layer 103 interposed therebetween. A portion at which both the electrode layers overlap each other defines a vibrating portion. When an AC electric field is applied between the first side electrode layer 104 and the second side electrode layer 105, the vibrating portion is excited. The acoustic wave resonator 101 is a resonator utilizing thickness longitudinal vibration of a bulk wave that is generated from the excitation of the vibrating portion.

The filter according to the present preferred embodiment includes the first terminal T1, the second terminal T2, the series resonators S1 to S5 that are disposed in series in the first path r1 interconnecting the first terminal T1 and the second terminal T2, the parallel resonators P1 and P4 that are disposed in the paths interconnecting respectively the nodes n1 to n4 between adjacent pairs of the series resonators S1 to S5 in the first path r1 and the ground, the first inductor L1 that is disposed in the first path r1 between the first terminal T1 and the series resonator S1, i.e., one of the series resonators S1 to S5 being closest to the first terminal T1, and the second inductor L2 that is disposed in the first path r1 between the second terminal T2 and the series resonator S5, i.e., one of the series resonators S1 to S5 being closest to the second terminal T2.

The series resonators S1 to S5 and the parallel resonators P1 and P4 are each defined by piezoelectric thin film resonators utilizing the thickness longitudinal vibration of the bulk wave. Each resonator includes the piezoelectric layer 103, the first side electrode layer 104 provided at one principal surface of the piezoelectric layer 103, and the second side electrode layer 105 provided at the other principal surface of the piezoelectric layer 103.

Where an average thickness of the first side electrode layer 104 and the second side electrode layer 105 in the series resonator S1 is referred to as a first thickness, an average thickness of the first side electrode layer 104 and the second side electrode layer 105 in each of the series resonators S2 to S4 other than the series resonators S1 and S5 is referred to as a second thickness, and an average thickness of the first side electrode layer 104 and the second side electrode layer 105 in the series resonator S5 is referred to as a third thickness, the first thickness and the third thickness are each preferably smaller than the second thickness.

By satisfying the above-described relationships in terms of thickness of the electrode layer, the filter according to Preferred Embodiment 3 is able to widen the pass band width of the filter, to reduce or prevent the spurious resonance that may be generated at the frequency different from the resonant frequency, and to increase the attenuation outside the pass band.

The above-described relationships in terms of thickness of the electrode layer in the filter according to Preferred Embodiment 3 may be replaced in another expression with relationships in terms of resonant frequency as follows. Where the resonant frequency of the series resonator S1 is referred to as the first resonant frequency, the resonant frequency of each of the series resonators S2 to S4 other than the series resonator S1 and the series resonator S5 is referred to as the second resonant frequency, and the resonant frequency of the series resonator S5 is referred to as the third resonant frequency, the first resonant frequency and the third resonant frequency are each preferably higher than second resonant frequency.

By satisfying the above-described relationships in terms of resonant frequency, the filter according to Preferred Embodiment 3 is able to widen the pass band width of the filter, to reduce or prevent the spurious resonance that may generate at the frequency different from the resonant frequency, and to increase the attenuation outside the pass band.

Preferred Embodiment 4

An acoustic wave resonator 201 according to Preferred Embodiment 4 of the present invention will be described below with reference to FIG. 15. The acoustic wave resonator 201 in Preferred Embodiment 4 is different from the acoustic wave resonator in Preferred Embodiment 1, which utilizes a surface acoustic wave, in that the acoustic wave resonator 201 is a piezoelectric thin film resonator utilizing thickness longitudinal vibration of a bulk wave.

Figure 15:
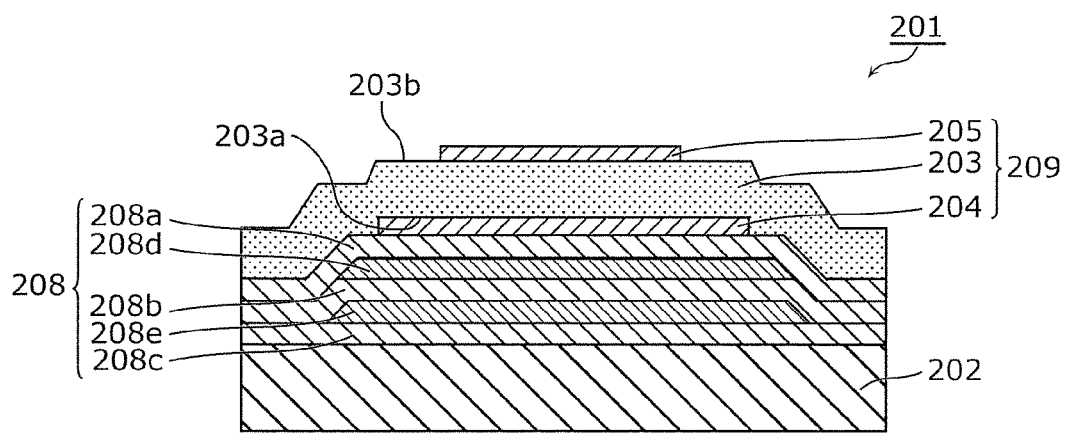
FIG. 15 is a sectional view of an acoustic wave resonator in a filter according to Preferred Embodiment 4 of the present invention.

FIG. 15 is a sectional view of the acoustic wave resonator 201 in a filter according to Preferred Embodiment 4.

As illustrated in FIG. 15, an acoustic reflection layer 208 and a thin-film multilayer portion 209 are laminated in that order on a substrate 202 in a region in which the acoustic wave resonator 201 is to be provided.

The acoustic reflection layer 208 includes first acoustic impedance layers 208a to 208c each made of a material having a relatively low acoustic impedance and second acoustic impedance layers 208d and 208e each made of a material having a relatively high acoustic impedance that are alternatively laminated. In other words, the acoustic impedance layers 208a to 208e are successively laminated from a piezoelectric vibrating portion, described later, toward the substrate 202 in the order of the first acoustic impedance layer 208a, the second acoustic impedance layer 208d, the first acoustic impedance layer 208b, the second acoustic impedance layer 208e, and the first acoustic impedance layer 208c.

The first acoustic impedance layers 208a to 208c and the second acoustic impedance layers 208d and 208e may be made with an appropriate inorganic or organic material.

The first acoustic impedance layers 208a to 208c may preferably be made using, for example, an inorganic material, such as $SiO_2$ or SiOC, or an organic material, such as a polymer material such as benzocyclobutene (BCB) or polyimide. The second acoustic impedance layers 208d and 208e may preferably be made using, for example, a metal such as W, Ir, Pt or Mo, an inorganic compound such as AlN, SiN, $Al_2O_3$ or $Ta_2O_5$, or an appropriate organic material.

The thin-film multilayer portion 209 is laminated on the acoustic reflection layer 208. The thin-film multilayer portion 209 includes a piezoelectric layer 203 having a polarization axis aligned with a thickness direction, a first side electrode layer 204 disposed at a lower surface 203a of the piezoelectric layer 203 (i.e., at the side at which the acoustic reflection layer 208 is present), and a second side electrode layer 205 disposed at an upper surface 203b of the piezoelectric layer 203. In the acoustic wave resonator 201, a resonant frequency is able to be changed by changing a thickness of the first side electrode layer 204 or the second side electrode layer 205.

The piezoelectric layer 203 is made of an appropriate piezoelectric single crystal or piezoelectric ceramic having piezoelectricity. Such a piezoelectric material may preferably be, for example, AlN, ZnO, $LiNbO_3$, $LiTaO_3$, $KNbO_3$, or a lead zirconate titanate-based piezoelectric ceramic.

The first side electrode layer 204 and the second side electrode layer 205 are each made of an appropriate conductive material. Such a conductive material may preferably be, for example, an appropriate metal such as Al, Pt, Au, Mo, W, Ti, Cr, Cu, Ru, Ir or Ta, or an alloy of any of those metals. The first side electrode layer 204 and the second side electrode layer 205 may be made of a multilayer metal film formed by laminating a plurality of metal films each made of the above-described metal or alloy.

In the present preferred embodiment, a portion in which the first side electrode layer 204 and the second side electrode layer 205 overlap each other with the piezoelectric layer 203 interposed therebetween defines a piezoelectric vibrating portion. When an AC electric field is applied between the first side electrode layer 204 and the second side electrode layer 205, the electric field is applied to the piezoelectric vibrating portion, such that the piezoelectric vibrating portion is excited. As a result, resonance characteristics utilizing thickness longitudinal vibration of energy confinement type are able to be obtained.

The filter according to the present preferred embodiment includes the first terminal T1, the second terminal T2, the series resonators S1 to S5 that are disposed in series in the first path r1 interconnecting the first terminal T1 and the second terminal T2, the parallel resonators P1 and P4 that are disposed in the paths interconnecting respectively the nodes n1 to n4 between adjacent twos of the series resonators S1 to S5 in the first path r1 and the ground, the first inductor L1 that is disposed in the first path r1 between the first terminal T1 and the series resonator S1, i.e., one of the series resonators S1 to S5 being closest to the first terminal T1, and the second inductor L2 that is disposed in the first path r1 between the second terminal T2 and the series resonator S5, i.e., one of the series resonators S1 to S5 being closest to the second terminal T2.

The series resonators S1 to S5 and the parallel resonators P1 and P4 are each defined by a piezoelectric thin film resonator utilizing the thickness longitudinal vibration of the bulk wave. Each resonator includes the piezoelectric layer 203, the first side electrode layer 204 provided at one principal surface of the piezoelectric layer 203, and the second side electrode layer 205 provided at the other principal surface of the piezoelectric layer 203.

Where an average thickness of the first side electrode layer 204 and the second side electrode layer 205 in the series resonator S1 is referred to as a first thickness, an average thickness of the first side electrode layer 204 and the second side electrode layer 205 in each of the series resonators S2 to S4 other than the series resonators S1 and S5 is referred to as a second thickness, and an average thickness of the first side electrode layer 204 and the second side electrode layer 205 in the series resonator S5 is referred to as a third thickness, the first thickness and the third thickness are each preferably smaller than the second thickness.

By satisfying the above-described relationships in terms of thickness of the electrode layer, the filter according to Preferred Embodiment 4 is able to widen the pass band width of the filter, to reduce or prevent the spurious resonance that may generate at the frequency different from the resonant frequency, and to increase the attenuation outside the pass band.

The above-described relationships in terms of thickness of the electrode layer in the filter according to Preferred Embodiment 4 may be replaced in another expression with relationships in terms of resonant frequency as follows. Where the resonant frequency of the series resonator S1 is referred to as the first resonant frequency, the resonant frequency of each of the series resonators S2 to S4 other than the series resonator S1 and the series resonator S5 is referred to as the second resonant frequency, and the resonant frequency of the series resonator S5 is referred to as the third resonant frequency, the first resonant frequency and the third resonant frequency are each preferably higher than second resonant frequency.

By satisfying the above-described relationships in terms of resonant frequency, the filter according to Preferred Embodiment 4 is able to widen the pass band width of the filter, to reduce or prevent the spurious resonance that may generate at the frequency different from the resonant frequency, and to increase the attenuation outside the pass band.

While the filters according to preferred embodiments of the present invention have been described in connection with Preferred Embodiments, the present invention further includes other preferred embodiments provided by combining preferable elements in the above-described preferred embodiments with each other, modifications obtained by modifying the above-described preferred embodiments based on ideas, which are conceivable by those skilled in the art, within the scope not departing from the gist of the present invention, and various devices including the filters according to the preferred embodiments and modifications of the present invention.

For instance, while the filter 1 according to Preferred Embodiment 1 represents an example in which two inductors L1 and L2 are connected in series to the ladder filter circuit 2, only one inductor L1 may be connected in series to the ladder filter circuit 2.

More specifically, the filter 1 may be defined as follows. The filter 1 includes the first terminal T1, the second terminal T2, the series resonators S1 to S5 that are disposed in series in the first path r1 interconnecting the first terminal T1 and the second terminal T2, the parallel resonators P1 and P4 that are disposed in the paths interconnecting respectively the nodes n1 to n4 between adjacent pairs of the series resonators S1 to S5 in the first path r1 and the ground, and the first inductor L1 that is disposed in the first path r1 between the first terminal T1 and the series resonator S1, i.e., one of the series resonators S1 to S5 being closest to the first terminal T1, wherein each of the series resonators S1 to S5 and the parallel resonators P1 and P4 includes the IDT electrode 32 that is provided on the substrate 320 having piezoelectricity, wherein the IDT electrode 32 includes the electrode fingers 322a and 322b that are arranged to extend in the direction perpendicular or substantially perpendicular to the acoustic wave propagation direction D1, and wherein, where the average pitch of the electrode fingers 322a and 322b adjacent to each other in the acoustic wave propagation direction D1 in the series resonator S1 is referred to as the first pitch pt1, and the average pitch of the electrode fingers 322a and 322b adjacent to each other in the acoustic wave propagation direction D1 in each of the series resonators S2 to S5 other than the series resonator S1 is referred to as the second pitch pt2, the first pitch pt1 is preferably not less than, for example, about 0.952 times and not more than about 0.98 times the second pitch pt2.

While Preferred Embodiment 1 has been described above in connection with an example including one filter, the filters according to any of the preferred embodiments of the present invention may be used in multiplexers to transmit and/or receive signals in a plurality of frequency bands at the same time. For instance, the filter according to any of the preferred embodiments of the present invention may be applied to a diplexer in which respective first terminals of two filters are provided as a common terminal, a triplexer in which respective first terminals of three filters are provided as a common terminal, and a hexaplexer in which respective first terminals of six filters are provided as a common terminal. In other words, the filters according to any of the preferred embodiments of the present invention may be used to provide multiplexers including the one or more filters 1.

Figure 16:
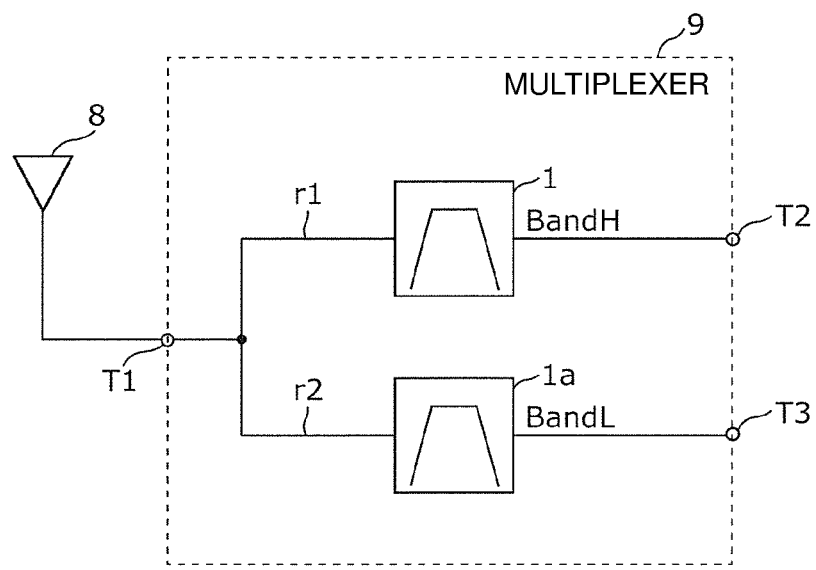
FIG. 16 is a circuit diagram of a multiplexer including the filter according to Preferred Embodiment 5 of the present invention.

FIG. 16 is a circuit diagram of a multiplexer 9 including the filter 1 according to Preferred Embodiment 1. The multiplexer 9 illustrated in FIG. 16 is a diplexer, and it includes a first terminal T1, a second terminal T2, a third terminal T3, the filter 1, and a filter 1a.

The first terminal T1 is disposed in common to the filter 1 and the filter 1a, and is connected to the filter 1 and the filter 1a inside the multiplexer 9. Furthermore, the first terminal T1 is connected to an antenna element 8 outside the multiplexer 9. Thus, the first terminal T1 also defines and functions as an antenna terminal of the multiplexer 9.

The second terminal T2 is connected to the filter 1 inside the multiplexer 9. The third terminal T3 is connected to the filter 1a inside the multiplexer 9. Furthermore, the second terminal T2 and the third terminal T3 are connected, outside the multiplexer 9, to an RFIC (Radio Frequency Integrated Circuit, not illustrated) through an amplifier circuit and so on (not illustrated).

The filter 1 is disposed in a first path r1 interconnecting the first terminal T1 and the second terminal T2. The filter 1 has a pass band denoted as Band H (high band), for example. The filter 1a is disposed in a second path r2 interconnecting the first terminal T1 and the third terminal T3. The filter 1a has a pass band given as Band L (low band), for example. The filter 1 and the filter 1a are required to have characteristics that enable the corresponding Band to pass therethrough while attenuating the other band. In the present preferred embodiment, the filter 1 is set, for example, to have a higher frequency band than the filter 1a.

While Preferred Embodiment 1 has been described above in connection with an example in which the resonator does not include offset electrode fingers (i.e., fingers projecting toward the electrode fingers from the busbar electrode being opposite the electrode fingers), preferred embodiments of the present invention are not limited to such an example, and each resonator may include the offset electrode fingers.

Materials of the close contact layer 324, the main electrode layer 325, and the protective layer 326, which define the IDT electrode 32 and the reflectors, are not limited to the above-described materials. Furthermore, the IDT electrode 32 is not always required to have the above-described multilayer structure. The IDT electrode 32 may be defined, for example, by using a metal such as Ti, Al, Cu, Pt, Au, Ag or Pd, or an alloy of any of those metals, or by using a plurality of multilayer bodies each made of the above-described metal or alloy. The protective layer 326 is not always required to be provided.

Moreover, in the substrate 320 of the resonator in Preferred Embodiment 1, the high acoustic-velocity support substrate 329 may have a multilayer structure including a support substrate and a high acoustic-velocity film in which a bulk wave propagates at a higher acoustic velocity than acoustic waves, i.e., a surface acoustic wave and a boundary acoustic wave, propagating in the piezoelectric layer 327.

While Preferred Embodiment 1 has been described above in connection with an example in which the IDT electrode 32 defining the filter 1 is provided on the substrate 320 including the piezoelectric layer 327, the substrate on which the IDT electrode 32 is provided may be a piezoelectric substrate that includes a single layer of the piezoelectric layer 327. The piezoelectric substrate in this case is preferably made of, for example, LiTaO$_3$ as one type of piezoelectric single crystal, or LiNbO$_3$ as another type of piezoelectric single crystal. Additionally, the substrate 320 on which the IDT electrode 32 is provided may have any of suitable structures having piezoelectricity, including not only a structure entirely made of a piezoelectric layer, but also a structure in which a piezoelectric layer is laminated on a support substrate.

While the piezoelectric layer 327 in Preferred Embodiment 1 preferably uses a 50° Y cut X SAW propagation LiTaO$_3$ piezoelectric single crystal, the cut angle of the single crystal material is not limited to such an example. In other words, the multilayer structure, the material, and the thickness of the piezoelectric layer 327 may be changed depending on desired bandpass characteristics of the acoustic wave filter device, and other characteristics and factors. Similar advantageous effects to those described above are able to be obtained with surface acoustic wave filters using, for example, the LiTaO$_3$ piezoelectric substrates or the LiNbO$_3$ piezoelectric substrates with cut angles other than described above.

Preferred embodiments of the present invention may be used as a filter capable of being applied to a multiband system, and may be widely used in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
   a first terminal and a second terminal;
   a number n of series resonators, where n is a natural number of three or more, that are disposed in series in a first path interconnecting the first terminal and the second terminal;
   one or more parallel resonators that are disposed in paths interconnecting respectively nodes between adjacent pairs of the series resonators in the first path and a ground;
   a first inductor that is disposed in the first path between the first terminal and a first series resonator among the number n of series resonators, the first series resonator being closest to the first terminal; and
   a second inductor that is disposed in the first path between the second terminal and an n-th series resonator among the number n of series resonators, the n-th series resonator being closest to the second terminal; wherein
   where a resonant frequency of the first series resonator is referred to as a first resonant frequency, a resonant frequency of each of the series resonators other than the first series resonator and the n-th series resonator is referred to as a second resonant frequency, and a resonant frequency of the n-th series resonator is referred to as a third resonant frequency, the first resonant frequency and the third resonant frequency are each higher than the second resonant frequency.

2. The filter according to claim 1, wherein
   each of the number n of series resonators and the one or more parallel resonators includes an IDT electrode that is provided on a substrate having piezoelectricity;
   the IDT electrode includes a plurality of electrode fingers that extend in a direction perpendicular or substantially perpendicular to an acoustic wave propagation direction; and
   where an average pitch of the plurality of electrode fingers adjacent to each other in the acoustic wave propagation direction in the first series resonator is referred to as a first pitch, an average pitch of the plurality of electrode fingers adjacent to each other in the acoustic wave propagation direction in each of the series resonators other than the first series resonator and the n-th series resonator is referred to as a second pitch, and an average pitch of the plurality of electrode fingers adjacent to each other in the acoustic wave propagation direction in the n-th series resonator is referred to as a third pitch, the first pitch and the third pitch are each smaller than the second pitch.

3. The filter according to claim 2, wherein the first pitch and the third pitch are each not less than about 0.952 times and not more than about 0.98 times the second pitch.

4. The filter according to claim 1, wherein capacitances of the first series resonator and the n-th series resonator are each smaller than a capacitance of each of the other series resonators.

5. The filter according to claim 1, wherein division numbers of the first series resonator and the n-th series resonator are each greater than a division number of each of the other series resonators.

6. The filter according to claim 1, wherein the number n of series resonators is five or more series resonators.

7. The filter according to claim 1, wherein the filter has a pass band at frequencies of not lower than about 2496 MHz and not higher than about 2690 MHz.

8. The filter according to claim 1, wherein
the number n of series resonators and the one or more parallel resonators are each a piezoelectric thin film resonator utilizing thickness longitudinal vibration of a bulk wave, each resonator including a piezoelectric layer, a first side electrode layer provided at one principal surface of the piezoelectric layer, and a second side electrode layer provided at the other principal surface of the piezoelectric layer; and
where an average thickness of the first side electrode layer and the second side electrode layer in the first series resonator is referred to as a first thickness, an average thickness of the first side electrode layer and the second side electrode layer in each of the series resonators other than the first series resonator and the n-th series resonator is referred to as a second thickness, and an average thickness of the first side electrode layer and the second side electrode layer in the n-th series resonator is referred to as a third thickness, the first thickness and the third thickness are each smaller than the second thickness.

9. A multiplexer for transmitting and/or receiving signals in a plurality of frequency bands at a same time, the multiplexer comprising:
at least one of the filter according to claim 1.

10. The multiplexer according to claim 9, wherein
the number n of series resonators and the one or more parallel resonators are each a piezoelectric thin film resonator utilizing thickness longitudinal vibration of a bulk wave, each resonator including a piezoelectric layer, a first side electrode layer provided at one principal surface of the piezoelectric layer, and a second side electrode layer provided at the other principal surface of the piezoelectric layer; and
where an average thickness of the first side electrode layer and the second side electrode layer in the first series resonator is referred to as a first thickness, an average thickness of the first side electrode layer and the second side electrode layer in each of the series resonators other than the first series resonator and the n-th series resonator is referred to as a second thickness, and an average thickness of the first side electrode layer and the second side electrode layer in the n-th series resonator is referred to as a third thickness, the first thickness and the third thickness are each smaller than the second thickness.

11. The multiplexer according to claim 9, wherein
each of the number n of series resonators and the one or more parallel resonators includes an IDT electrode that is provided on a substrate having piezoelectricity;
the IDT electrode includes a plurality of electrode fingers that extend in a direction perpendicular or substantially perpendicular to an acoustic wave propagation direction; and
where an average pitch of the plurality of electrode fingers adjacent to each other in the acoustic wave propagation direction in the first series resonator is referred to as a first pitch, an average pitch of the plurality of electrode fingers adjacent to each other in the acoustic wave propagation direction in each of the series resonators other than the first series resonator and the n-th series resonator is referred to as a second pitch, and an average pitch of the plurality of electrode fingers adjacent to each other in the acoustic wave propagation direction in the n-th series resonator is referred to as a third pitch, the first pitch and the third pitch are each smaller than the second pitch.

12. The multiplexer according to claim 11, wherein the first pitch and the third pitch are each not less than about 0.952 times and not more than about 0.98 times the second pitch.

13. The multiplexer according to claim 9, wherein capacitances of the first series resonator and the n-th series resonator are each smaller than a capacitance of each of the other series resonators.

14. The multiplexer according to claim 9, wherein division numbers of the first series resonator and the n-th series resonator are each greater than a division number of each of the other series resonators.

15. The multiplexer according to claim 9, wherein the number n of series resonators is five or more series resonators.

16. The multiplexer according to claim 9, wherein the at least one filter has a pass band at frequencies of not lower than about 2496 MHz and not higher than about 2690 MHz.

17. A filter comprising:
a first terminal and a second terminal;
three or more series resonators that are disposed in series in a first path interconnecting the first terminal and the second terminal;
one or more parallel resonators that are disposed in paths interconnecting respectively nodes between adjacent pairs of the series resonators in the first path and a ground; and
a first inductor that is disposed in the first path between the first terminal and a first series resonator among the three or more series resonators, the first series resonator being closest to the first terminal; wherein
each of the three or more series resonators and the one or more parallel resonators includes an IDT electrode that is provided on a substrate having piezoelectricity;
the IDT electrode includes a plurality of electrode fingers that extend in a direction perpendicular or substantially perpendicular to an acoustic wave propagation direction; and
where an average pitch of the plurality of electrode fingers adjacent to each other in the acoustic wave propagation direction in the first series resonator is referred to as a first pitch, and an average pitch of the electrode fingers adjacent to each other in the acoustic wave propagation direction in each of the series resonators other than the first series resonator is referred to as a second pitch, the first pitch is not less than about 0.952 times and not more than about 0.98 times the second pitch.

18. A multiplexer for transmitting and/or receiving signals in a plurality of frequency bands at a same time, the multiplexer comprising:

at least one of the filter according to claim 17.

* * * * *